US012805048B2

(12) United States Patent
Morita et al.

(10) Patent No.: US 12,805,048 B2
(45) Date of Patent: Nov. 17, 2026

(54) SEMICONDUCTOR DEVICE AND APPARATUS

(71) Applicant: Canon Kabushiki Kaisha, Tokyo (JP)

(72) Inventors: Tomotake Morita, Kanagawa (JP); Yoshiei Tanaka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 329 days.

(21) Appl. No.: 18/389,964

(22) Filed: Dec. 20, 2023

(65) Prior Publication Data

US 2024/0213285 A1 Jun. 27, 2024

(30) Foreign Application Priority Data

Dec. 26, 2022 (JP) ................................ 2022-208801

(51) Int. Cl.
*H10F 39/00* (2025.01)

(52) U.S. Cl.
CPC ......... *H10F 39/811* (2025.01); *H10F 39/802* (2025.01)

(58) Field of Classification Search
CPC ............................ H10F 39/811; H10F 39/802
See application file for complete search history.

(56) References Cited

U.S. PATENT DOCUMENTS 11,398,518 B2 7/2022 Inoue et al.
2016/0233264 A1* 8/2016 Kagawa ................ H10F 39/811
2022/0165670 A1* 5/2022 Qian .................. H10W 20/023
2023/0283866 A1* 9/2023 Mase ..................... H04N 25/77 348/164
2023/0402316 A1* 12/2023 Wang ................ H10W 10/0143

FOREIGN PATENT DOCUMENTS

JP 2005191492 A 7/2005
JP 2014099582 A 5/2014
JP 2021153335 A 9/2021
WO 2015050000 A1 4/2015

OTHER PUBLICATIONS

Japanese Office Action dated Jun. 26, 2026 in counterpart Japanese Patent Appln. No. 2022-208801.

* cited by examiner

*Primary Examiner* — Sitaramarao S Yechuri
(74) *Attorney, Agent, or Firm* — Venable LLP

(57) ABSTRACT

A semiconductor device is provided. The device includes a semiconductor layer which forms a part of first and second surfaces respectively, a wiring structure arranged on the second surface, and a pad. An opening portion for exposing the pad is provided in the first surface. The pad is arranged between the first surface and a wiring layer closest to the second surface among wiring layers arranged in the wiring structure, and has a third surface which partially exposed by the opening portion. An insulating portion forming a part of the second surface is embedded in the semiconductor layer. An outer edge of the insulating portion is arranged so as to surround an outer edge of the pad. A wall surface of the opening portion is formed by the semiconductor layer and the insulating portion, or formed by the insulating portion.

26 Claims, 21 Drawing Sheets

SEMICONDUCTOR DEVICE AND APPARATUS

BACKGROUND OF THE INVENTION

Field of the Invention

The present invention relates to a semiconductor device and an apparatus.

Description of the Related Art

In a semiconductor device, improvement of the mounting density and miniaturization of the device are achieved. Japanese Patent Laid-Open No. 2021-153335 describes a back-side illumination type solid-state imaging sensor in which a pixel substrate formed with a photoelectric conversion element and a control substrate including a control circuit are stacked on each other. In the arrangement described in Japanese Patent Laid-Open No. 2021-153335, a pad for external connection is formed in a wiring layer, and a through hole for exposing the pad is also formed in an insulating film forming the wiring layer.

SUMMARY OF THE INVENTION

In order to suppress intrusion of moisture from the through hole to the photoelectric conversion element and the control circuit via the insulating film of the wiring layer to improve the reliability of the semiconductor device, it is conceivable to provide a metal ring structure so as to surround the through hole. However, if the ring structure is provided, the region to arrange the wiring pattern of the wiring layer is limited, and this can hinder improvement of the mounting density.

Some embodiments of the present invention provide a technique advantageous in improving the mounting density.

According to some embodiments, a semiconductor device comprising: a semiconductor layer, in which a semiconductor element is arranged, and which forms a part of a first surface and a part of a second surface; a wiring structure, which is arranged so as to cover the second surface, and includes, in an insulator, wiring layers each including a wiring pattern extending in a direction along the second surface; and a pad for external connection, wherein an opening portion for exposing the pad is provided in the first surface, the pad is arranged between the first surface and a wiring layer closest to the second surface among the wiring layers arranged in the wiring structure, and has a third surface which partially exposed by the opening portion, an insulating portion forming a part of the second surface is embedded in the semiconductor layer, a portion of the insulating portion forming the second surface is in contact with the insulator, in an orthogonal projection with respect to the first surface, an outer edge of the insulating portion is arranged so as to surround an outer edge of the pad, and a wall surface of the opening portion is formed by the semiconductor layer and the insulating portion, or formed by the insulating portion, is provided.

Further features of the present invention will become apparent from the following description of exemplary embodiments (with reference to the attached drawings).

DESCRIPTION OF THE EMBODIMENTS

Figure 1:
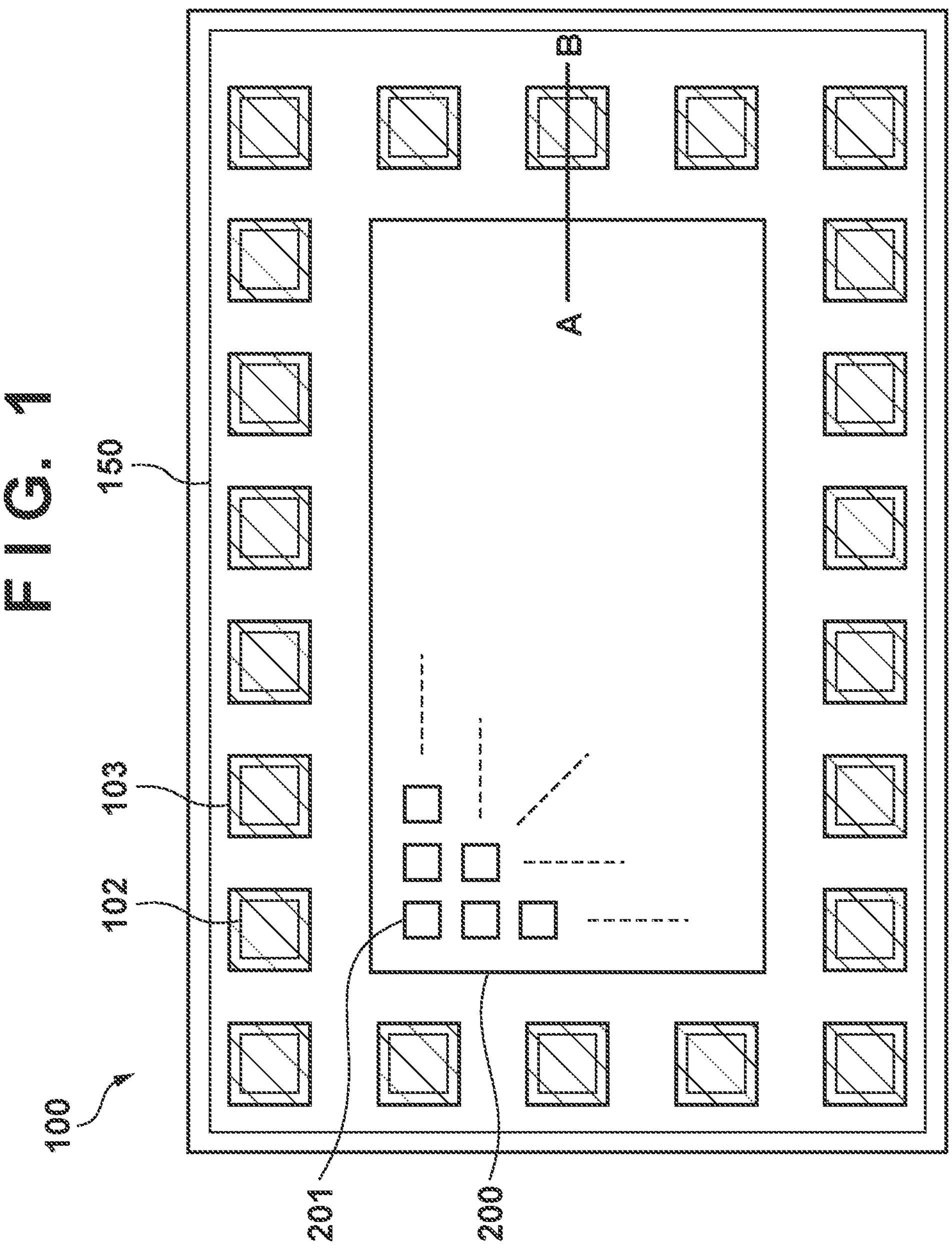
FIG. 1 is a plan view showing an arrangement example of a semiconductor device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
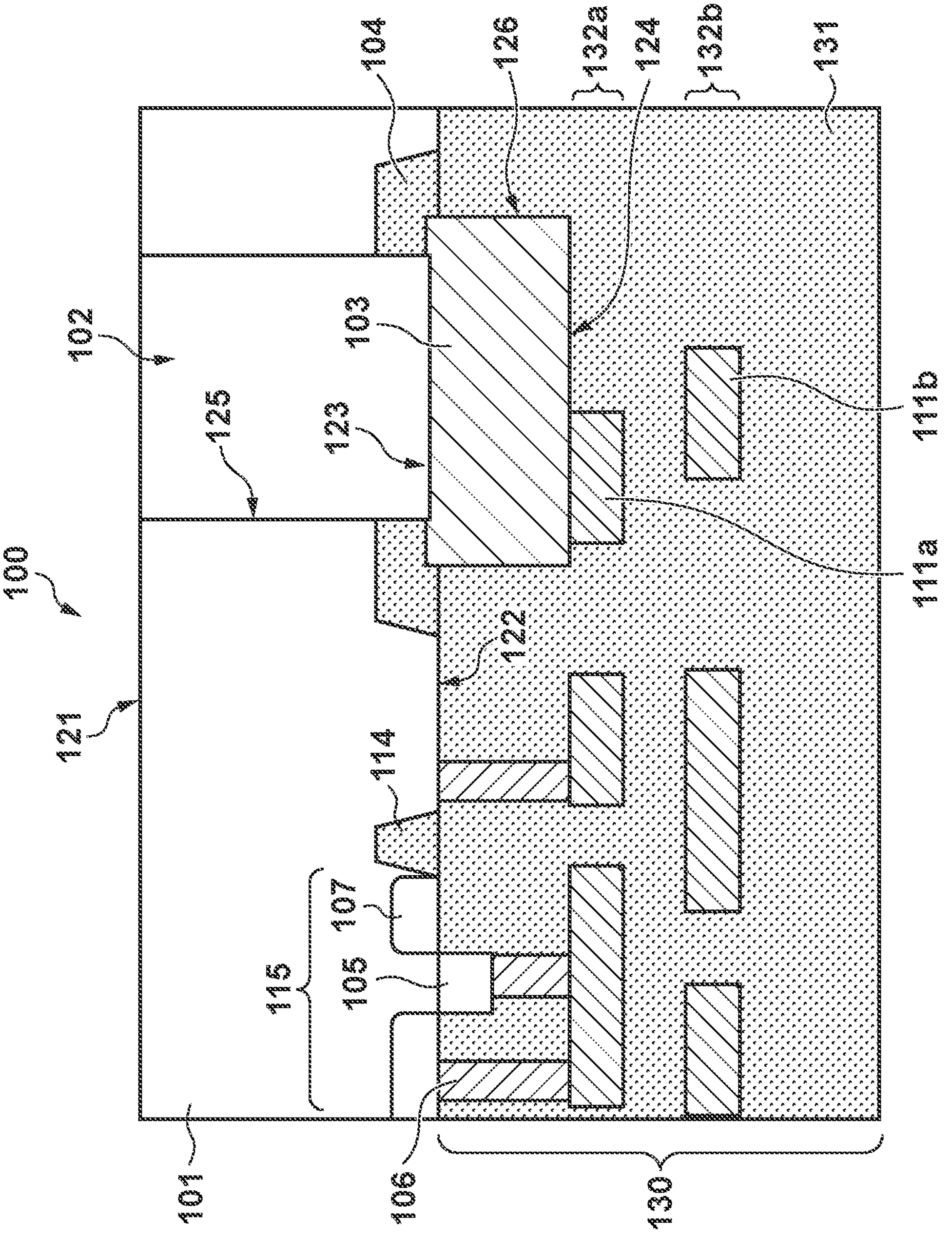
FIG. 2 is a sectional view showing the arrangement example of the semiconductor device shown in FIG. 1.

With reference to FIGS. 1 to 24, a semiconductor device according to an embodiment of the present disclosure will be described. FIG. 1 is a plan view showing an arrangement example of a semiconductor device 100 in the present disclosure. FIG. 2 is a view showing a section taken along a line A-B shown in FIG. 1.

FIG. 1 shows the semiconductor device 100 for one chip. The semiconductor device 100 includes a pixel region 200 in which a pixel 201 is arranged. Each pad 103 for external connection, which is used to connect the semiconductor device 100 and a device arranged outside the semiconductor device 100 or the like, is arranged around the pixel region 200. For example, a signal for controlling the operation of the semiconductor device 100 or the operation of the pixel 201 arranged in the pixel region 200, or the like is transmitted from the device outside the semiconductor device 100 to the semiconductor device 100 via the pad 103. Further, for example, a signal generated by the pixel 201, a signal obtained by processing, in the semiconductor device 100, a signal generated by the pixel 201, or the like is transmitted from the semiconductor device 100 to the device outside the semiconductor device 100 via the pad 103. As will be described with reference to FIG. 2, the pad 103 is exposed by an opening portion 102.

A humidity-resistance structure 150 is formed between the pad 103 and the outer edge of the semiconductor device 100 so as to surround the outer edge of the semiconductor device 100. The humidity-resistance structure 150 can be formed by a wiring pattern arranged in a wiring layer formed in the semiconductor device 100, or a conductive pattern connecting wiring patterns arranged in different wiring layers. For example, as the humidity-resistance structure 150, a wall may be formed by the conductive pattern in the thickness direction of an insulator in which the wiring layer (wiring pattern) is arranged. The wall formed by the conductive pattern can be arranged so as to surround the semiconductor device 100 along its outer edge as shown in FIG. 1. The humidity-resistance structure 150 suppresses diffusion of moisture from the end portion of the semiconductor device 100 to the pixel 201 arranged in the pixel region 200 and a circuit element for operating the pixel 201. Thus, the reliability of the semiconductor device 100 can be improved.

The pixel 201 arranged in the pixel region 200 may include, for example, a photoelectric conversion element. In this case, the semiconductor device 100 can also be called a photoelectric conversion device or an image capturing device. Alternatively, the pixel 201 arranged in the pixel region 200 may include, for example, a light emitting element. In this case, the semiconductor device 100 can also be called a light emitting device or a display device. It is described here that the semiconductor device 100 includes the pixel region 200, but the semiconductor device 100 may not necessarily include the pixel region 200 in which the pixel 201 is arranged. For example, the semiconductor device 100 may function as a processing device or a storage device in which various logic circuits or storage circuits are arranged. In a case in which the pad 103 for external connection is arranged in the semiconductor device 100, each embodiment to be described below according to the present disclosure is applicable.

FIG. 2 is a sectional view showing the vicinity of the pad 103 of the semiconductor device 100. The semiconductor device 100 includes a semiconductor layer 101, a wiring structure 130, and the above-described pad 103 for external connection. A semiconductor element is arranged in the semiconductor layer 101. As an example of the semiconductor element, a transistor 115 including a gate electrode 105 and a diffusion layer 107 is shown in FIG. 2. The semiconductor element arranged in the semiconductor layer 101 may be, for example, an element for operating the pixel 201 arranged in the pixel region 200. Alternatively, the semiconductor element arranged in the semiconductor layer 101 may be each element of the pixel 201 arranged in the pixel region 200.

The semiconductor layer 101 forms a part of a surface 121 and a part of a surface 122. Here, in the present disclosure, the surface 121 is defined as a surface that includes the upper surface of the semiconductor layer 101 shown in FIG. 2, and a virtual plane extending from the upper surface of the semiconductor layer 101 in the portion, such as the opening portion 102, where no semiconductor layer 101 is arranged. The surface 122 is defined as a surface that includes the lower surface of the semiconductor layer 101 shown in FIG. 2, and a virtual plane extending from the lower surface of the semiconductor layer 101 in the portions where an insulating portion 104 using a shallow trench isolation (STI) structure or the like, an element separation portion 114, and the like are embedded. Accordingly, as shown in FIG. 2, each of the insulating portion 104 and the element separation portion 114 may also form a part of the surface 122.

The wiring structure 130 is arranged so as to cover the surface 122, and includes a wiring layer 132 including, in an insulator 131, a wiring pattern 111 extending in a direction along the surface 122. In the arrangement shown in FIG. 2, two wiring layers of a wiring layer 132*a* and a wiring layer 132*b*, and wiring patterns 111*a* and 111*b* arranged in the wiring layers 132*a* and 132*b*, respectively, are shown in the wiring structure 130. However, the number of the wiring layers 132 is not limited to two, and it may be one, or three or more.

Next, the arrangement in the vicinity of the pad 103 arranged in the semiconductor device 100 will be described in more detail. As has been described above, the opening portion 102 for exposing the pad 103 is provided in the surface 121. The opening portion 102 is open from the surface 121 to a surface 123 which is the upper surface of the pad. At least a part of the pad 103 is arranged between the surface 121 and the wiring layer 132*a* closest to the surface 122 among the wiring layers 132 arranged in the wiring structure 130. Here, "between the surface 121 and the wiring layer 132*a*" means "between the surface 121 and the surface of the wiring pattern 111*a*, arranged in the wiring layer 132*a*, away from the surface 122 (in FIG. 2, the lower surface of the wiring pattern 111*a*). At least a part of the surface 123 of the pad 103 is exposed by the opening portion 102. As shown in FIG. 2, the opening portion 102 is not arranged in the wiring structure 130. The surface 123 of the pad 103 can be arranged between the surface 121 and the surface 122.

As has been described above, the insulating portion 104 forming a part of the surface 122 is embedded in the semiconductor layer 101. The portion of the insulating portion 104 forming the surface 122 is in contact with the insulator 131 of the wiring structure 130. In an orthogonal projection with respect to the surface 121, the outer edge of the insulating portion 104 is arranged so as to surround the outer edge of the pad 103. Here, a wall surface 125 of the opening portion 102 is formed by the semiconductor layer 101 and the insulating portion 104.

In a case in which the surface 123 of the pad 103 exposed by the opening portion 102 is arranged in the wiring structure 130, the opening portion 102 is also formed in the wiring structure 130. In this case, considering the reliability of the semiconductor device 100 and the like, it is necessary to suppress diffusion of moisture in the atmosphere via the insulator 131 of the wiring structure 130. Accordingly, it may become necessary to provide a ring structure made of a metal or the like so as to surround the opening portion 102 by using the wiring pattern 111 arranged in the wiring layer 132 of the wiring structure 130 or a conductive pattern connecting the wiring patterns 111 arranged in different wiring layers 132. If the ring structure is provided so as to correspond to each opening portion 102, the region to arrange the wiring pattern 111 of the wiring layer 132 is limited, and the mounting density of the semiconductor device 100 can decrease. On the other hand, in this embodiment, the surface 123 of the pad 103 is arranged between the surface 122 and the surface 121. In other words, the surface 123 of the pad 103 is arranged closer to the surface 121 side than the surface 122. Thus, the opening portion 102 is not arranged in the wiring structure 130. Hence, diffusion of moisture from the opening portion 102 via the insulator 131 of the wiring structure 130 can be suppressed. Accordingly, the necessity of providing the ring structure with respect to each opening portion 102 decreases. As shown in FIGS. 1 and 2, a ring structure using a metal or the like having a lower moisture permeability than the insulator 131 may not be provided around each opening portion 102. As a result, in the semiconductor device 100, the mounting density can be improved while ensuring the reliability.

As shown in FIG. 2, a part of the surface 123 of the pad 103 may be in contact with the insulating portion 104. In the orthogonal projection with respect to the surface 121, the outer edge of the pad 103 is arranged so as to surround the wall surface 125 of the opening portion 102. A side surface 126 of the pad 103 connecting the surface 123 and a surface 124 (lower surface) on the opposite side of the surface 123 is in contact with the insulating portion 104 and the wiring structure 130. In the orthogonal projection with respect to the surface 121, the outer edge of the insulating portion 104 is arranged so as to surround the wall surface 125 of the opening portion 102. Further, as shown in FIG. 2, the pad 103 may be in contact with the wiring pattern **111*a* arranged in the wiring layer 132*a* closest to the surface 122 among the wiring layers 132 arranged in the wiring structure 130**.

With reference to FIGS. 3 to 8, an example of steps of the manufacturing method in the vicinity of the pad 103 of the semiconductor device 100 shown in FIG. 2 will be described. The sectional view in the step to be described below is obtained by vertically reversing the sectional view shown in FIG. 2.

Figure 3:
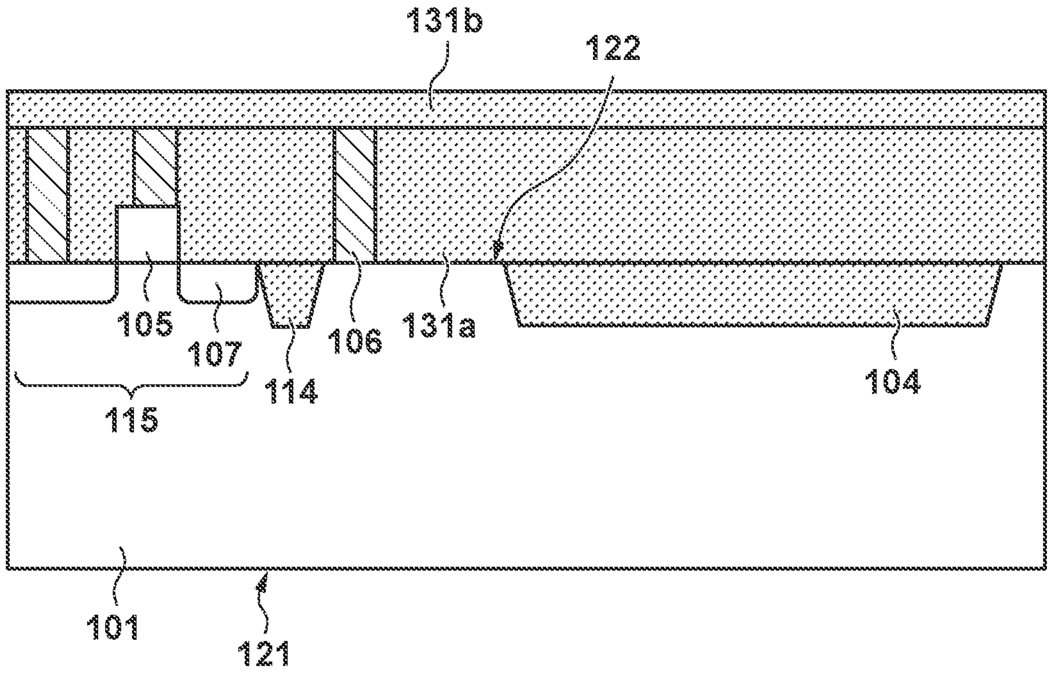
FIG. 3 is a sectional view showing an example of steps of a manufacturing method of the semiconductor device shown in FIG. 1.

First, on the semiconductor layer 101 using a semiconductor such as silicon, the semiconductor element such as the transistor 115, the element separation portion 114, and the insulating portion 104 are formed. For example, the element separation portion 114 and the insulating portion 104 may be simultaneously formed. Each of the element separation portion 114 and the insulating portion 104 may have the STI structure as shown in FIG. 3. For example, a material such silicon oxide can be used for the element separation portion 114 and the insulating portion 104.

On the surface 122 of the semiconductor layer 101, an insulator **131*a*, which forms a part of the insulator 131 of the wiring structure 130, is formed so as to cover the surface 122. A conductive pattern 106 to be used to connect to the wiring pattern 111 arranged in the wiring layer 132 in a subsequent step is formed in the insulator 131*a*. The conductive pattern 106 shown in FIG. 3 can be a conductive member used to electrically connect the semiconductor layer 101 to the wiring pattern 111*a* arranged in the wiring layer 132*a* closest to the surface 122 among the wiring layers 132 arranged in the wiring structure 130. On the insulator 131*a* with the conductive pattern 106 arranged therein, an insulator 131*b*, which forms a part of the insulator 131 of the wiring structure 130, is formed so as to cover the insulator 131*a*. An appropriate insulating material such as silicon oxide, silicon nitride, or silicon oxynitride can be used for the insulator 131 (insulators 131*a* and 131*b*). Each of the insulators 131*a* and 131*b* may have a single layer structure or a stacked structure. If each of the insulators 131*a* and 131*b* has a stacked structure, insulating films of different kinds may be stacked, or insulating films of the same kind may be stacked. An appropriate conductive material such as aluminum, copper, or tungsten can be used for the conductive pattern 106. The conductive pattern 106 may include, at the interface with the insulator 131*a***, a barrier metal layer containing a metal such as titanium.

Figure 4:
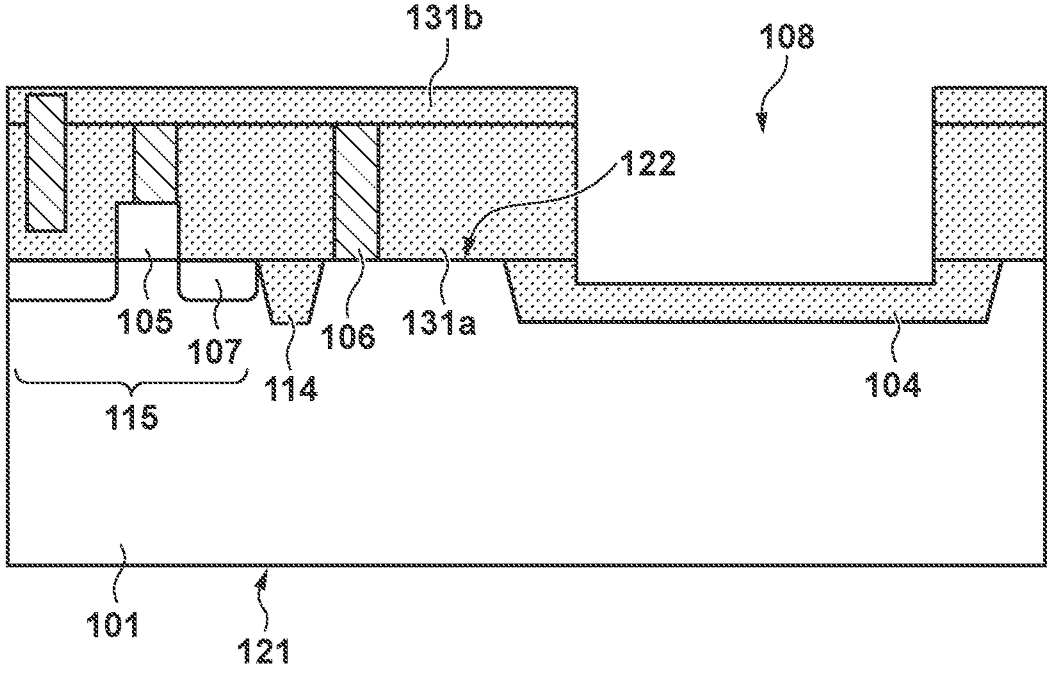
FIG. 4 is a sectional view showing the example of steps of the manufacturing method of the semiconductor device shown in FIG. 1.

Then, as shown in FIG. 4, a groove 108 is formed in the insulators **131*a* and 131*b*. The depth of the groove 108 is decided such that the material forming the pad 103 will have at least the thickness required for wire bonding in wire bonding with respect to the pad 103 to be formed in the groove 108 in a subsequent step. The side surface and bottom portion of the groove 108 is formed by the insulators 131*a* and 131*b* and the insulating portion 104. The groove 108 can be formed by etching not only a part of each of the insulators 131*a* and 131*b* but also a part of the insulating portion 104 as shown in FIG. 4. With this, as shown in FIG. 2, the surface 123 of the pad 103 will be arranged between the surface 121 and the surface 122**.

Figure 5:
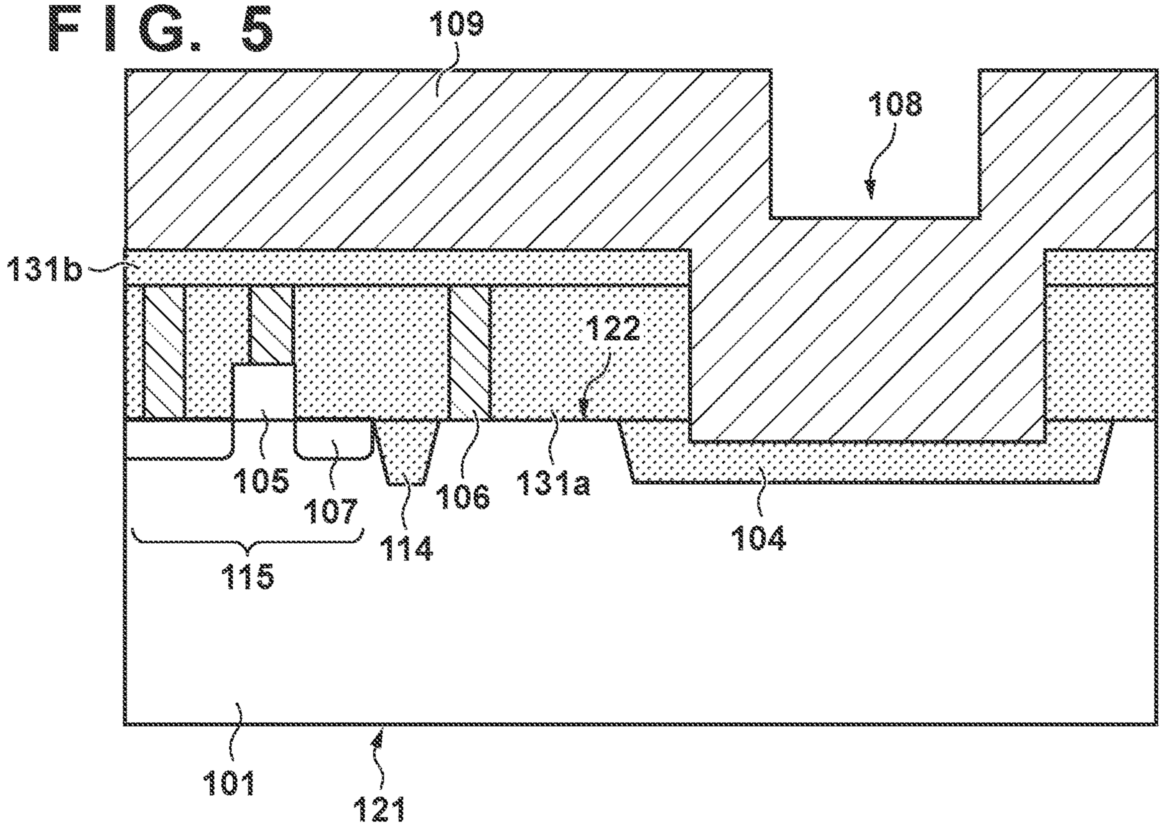
FIG. 5 is a sectional view showing the example of steps of the manufacturing method of the semiconductor device shown in FIG. 1.

After the groove 108 is formed, a conductive film 109 for forming the pad 103 is formed as shown in FIG. 5. For example, the conductive film 109 may be formed of a metal such as aluminum or an alloy thereof. The conductive film 109 may include, at the interface with the insulators **131*a* and 131*b* and the insulating portion 104 and the surface of the formed conductive film 109, a barrier metal layer containing a metal such as titanium. The conductive film 109 can be embedded in the groove 108 as shown in FIG. 5. The thickness of the conductive film 109 is decided such that the material forming the pad 103 will have at least the thickness required for wire bonding in wire bonding with respect to the pad 103**.

Figure 6:
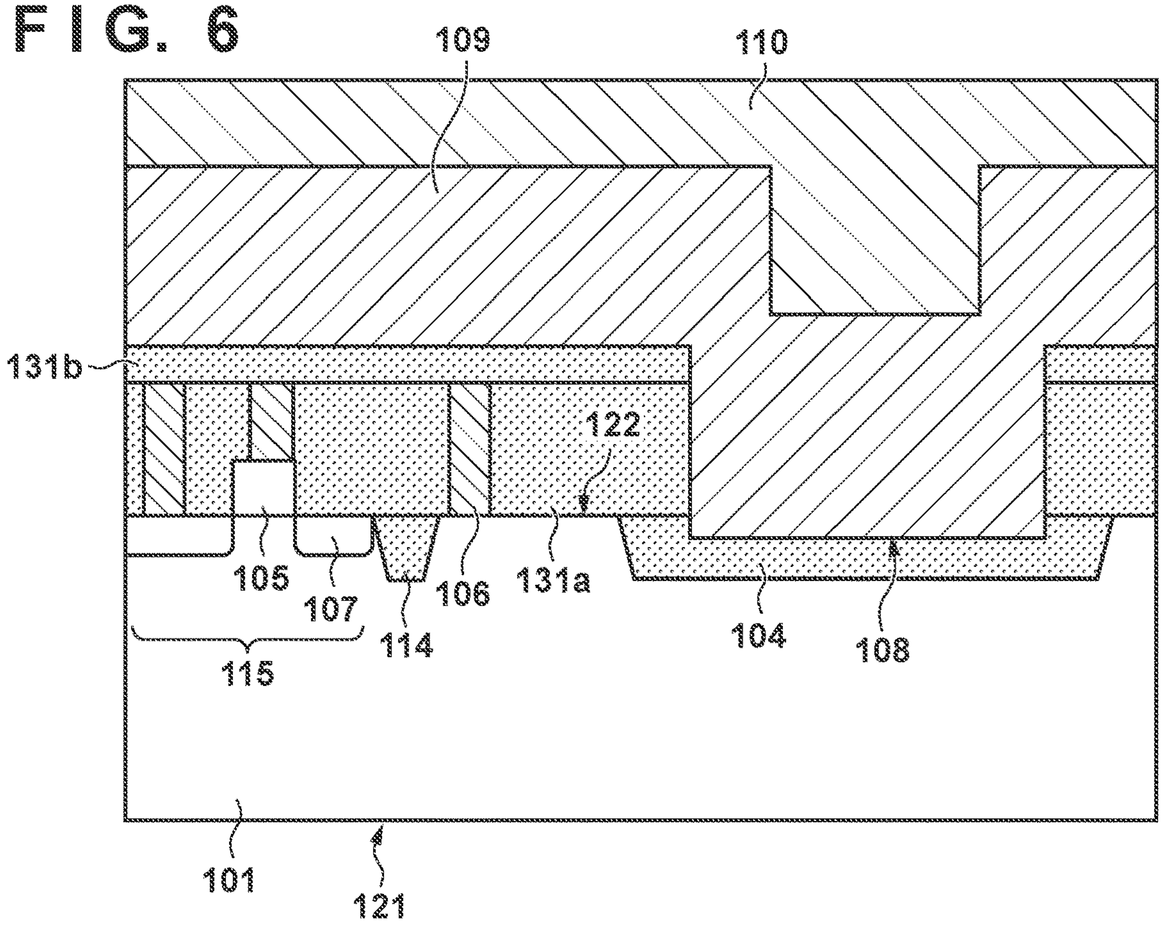
FIG. 6 is a sectional view showing the example of steps of the manufacturing method of the semiconductor device shown in FIG. 1.

After the conductive film 109 is formed, a resist film 110 is formed so as to cover the conductive film 109 as shown in FIG. 6. Then, as shown in FIG. 7, etching (etchback) is performed.

More specifically, first, the resist film 110 is etched until the conductive film 109 is exposed. The resist film 110 is thinner in the portion not corresponding to the groove 108 than in the portion corresponding to the groove 108. Accordingly, as the etching progresses, the conductive film 109 not corresponding to the groove 108 is exposed first. Then, when the conductive film 109 is exposed, the resist film 110 and the conductive film 109 are etched. By finishing etching when the insulator **131*b* is exposed, the conductive film 109 remains in the groove 108 as shown in FIG. 7**.

Figure 7:
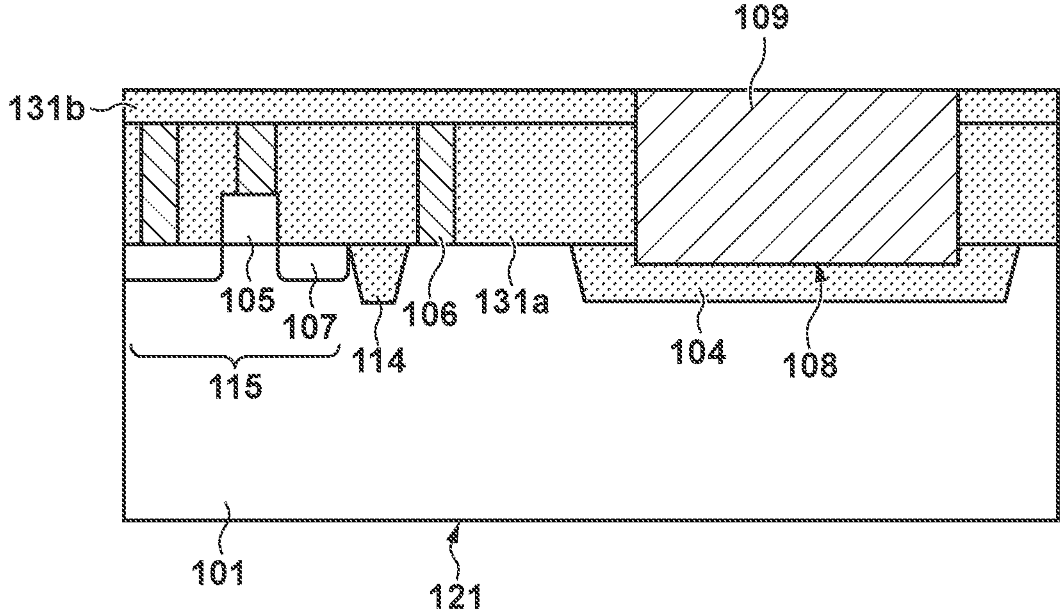
FIG. 7 is a sectional view showing the example of steps of the manufacturing method of the semiconductor device shown in FIG. 1.

In the above description, an etching process is used to form the arrangement shown in FIG. 7 from the arrangement shown in FIG. 5, but the present invention is not limited to this. For example, a chemical mechanical polishing (CMP)

process may be used to form the arrangement shown in FIG. 7 from the arrangement shown in FIG. 5.

Figure 8:
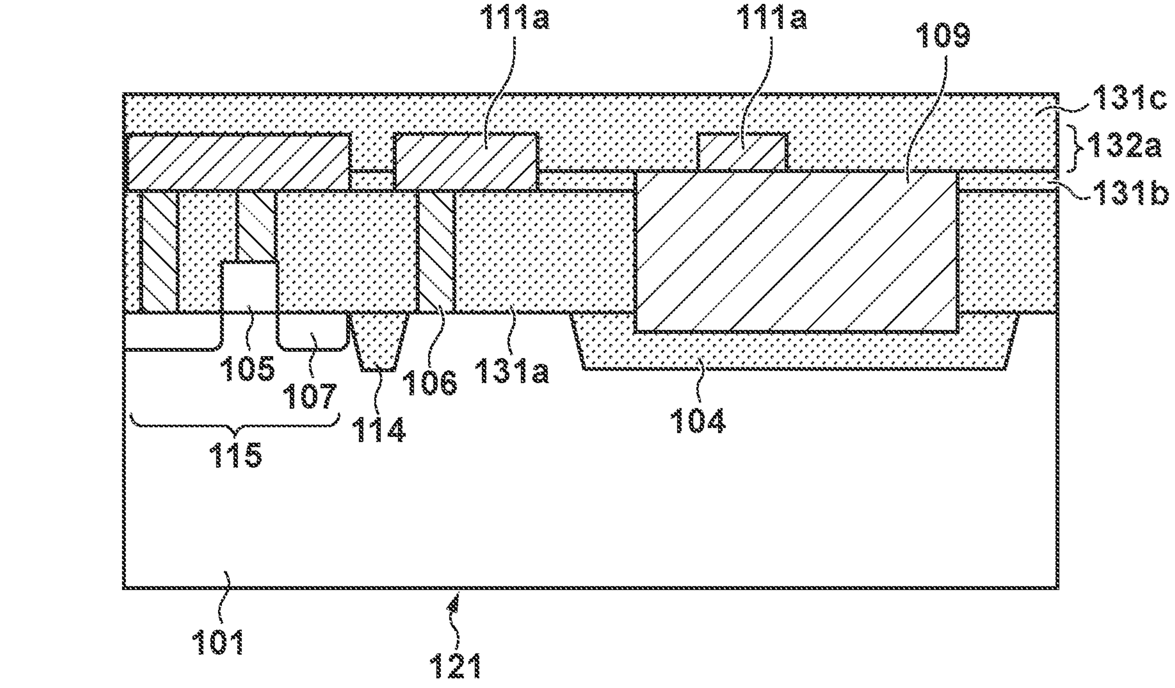
FIG. 8 is a sectional view showing the example of steps of the manufacturing method of the semiconductor device shown in FIG. 1.

Then, as shown in FIG. 8, the wiring pattern 111*a* of the wiring layer 132*a* closest to the surface 122 among the wiring layers 132 arranged in the wiring structure 130, and an insulator 131*c* forming the insulator 131 of the wiring structure 130 are formed. In FIG. 8, the insulator 131*c* is illustrated as one layer, but the insulator 131*c* may be formed by a plurality of layers. If the insulator 131*c* has a stacked structure, insulating films of different kinds may be stacked, or insulating films of the same kind may be stacked. A material similar to those of the insulators 131*a* and 131*b* can be used for the insulator 131*c*. For the wiring pattern 111, for example, aluminum, copper, or an alloy thereof can be used. The wiring pattern 111 may include, at the interface with the insulator 131 and the conductive film 109, a barrier metal layer containing a metal such as titanium.

As shown in FIG. 8, the conductive film 109 can be in contact with the wiring pattern 111*a* arranged in the wiring layer 132*a* closest to the surface 122 among the wiring layers 132 arranged in the wiring structure 130. The number, positions, and sizes of the wiring patterns 111 connected to the conductive film 109 can be decided, for example, in terms of the resistance value, capacitance, and reliability of the conductive film 109, the wiring pattern 111*a*, and the like.

The wiring layer 132*b* with the wiring pattern 111*b* arranged therein and the like are further formed with respect to the arrangement shown in FIG. 8. Further, the opening portion 102 extending from the surface 121 to the conductive film 109 is formed. With the steps described above, as shown in FIG. 2, the semiconductor device 100 in which the conductive film 109 functions as the pad 103 is manufactured.

Figure 9:
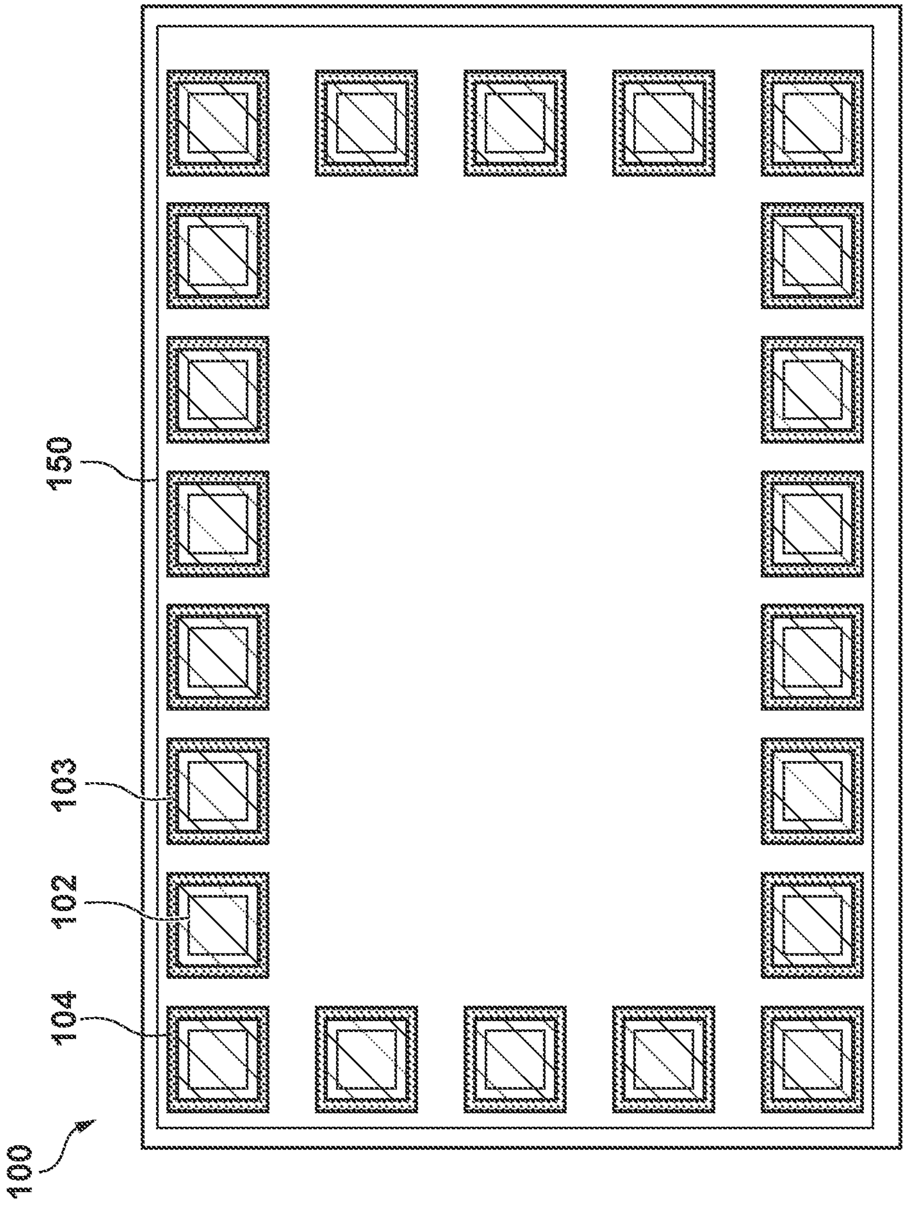
FIG. 9 is a plan view showing an arrangement example of the semiconductor device shown in FIG. 1.
Figure 10:
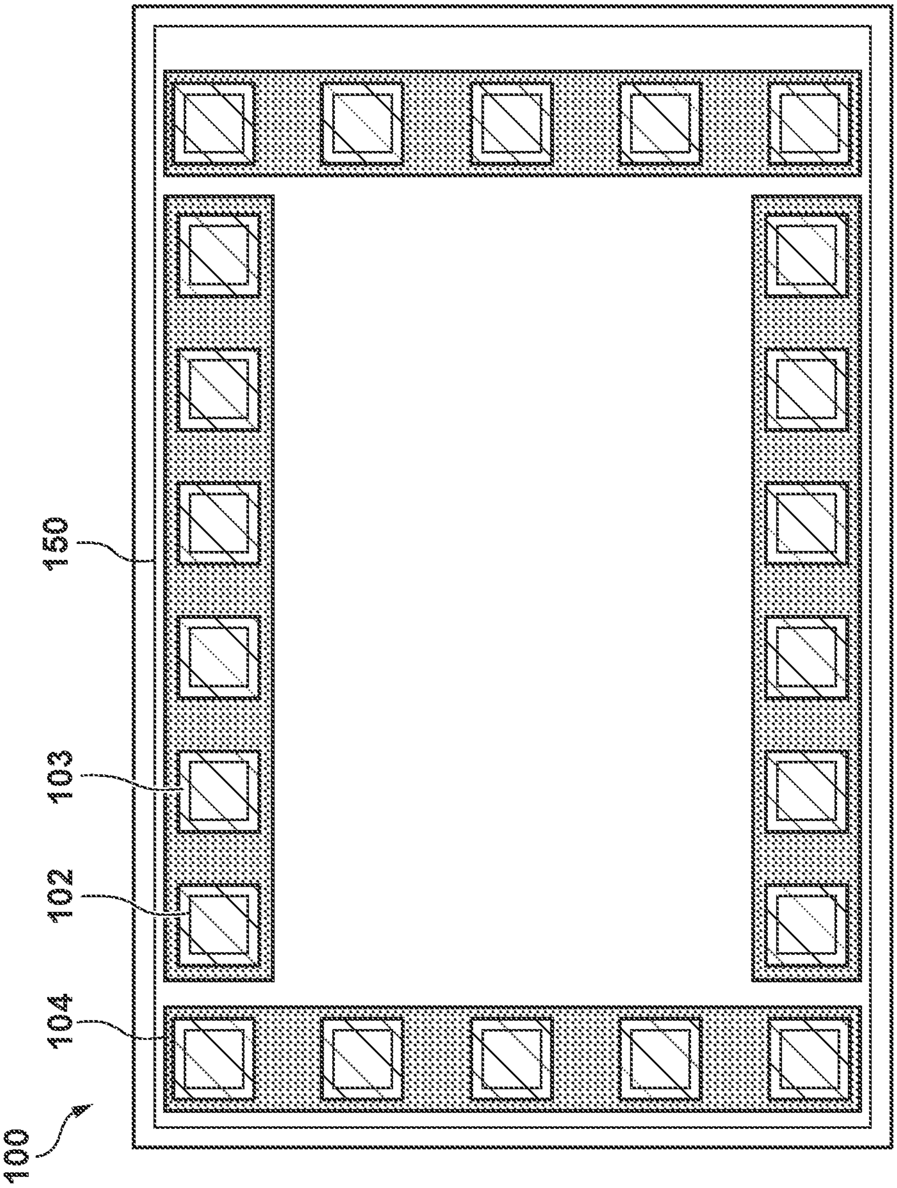
FIG. 10 is a plan view showing an arrangement example of the semiconductor device shown in FIG. 1.

Here, with reference to FIGS. 9 and 10, the arrangement of the opening portion 102, the pad 103, and the insulating portion 104 arranged in the semiconductor device 100 will be described. FIGS. 9 and 10 are views for explaining the arrangement of the opening portion 102, the pad 103, and the insulating portion 104, so that the components of the semiconductor device 100 other than the opening portion 102, the pad 103, and the insulating portion 104 are not illustrated, as appropriate. Each of FIGS. 9 and 10 is a plan view of the semiconductor device 100, which has the sectional structure shown in FIG. 2, observed from the surface 121 side.

As shown in FIGS. 9 and 10, in the orthogonal projection with respect to the surface 121, the outer edge of the insulating portion 104 is arranged so as to surround the outer edge of the pad 103. Further, in the orthogonal projection with respect to the surface 121, the outer edge of the pad 103 is arranged so as to surround the outer edge (wall surface 125) of the opening portion 102. In the arrangement shown in FIG. 9, one pad 103 is arranged in one insulating portion 104. On the other hand, in the arrangement shown in FIG. 10, a plurality of the pads 103 are arranged in one insulating portion 104. The number of the pads 103 arranged in one insulating portion 104 may be decided in accordance with the process of forming the insulating portion 104 on the surface of the semiconductor layer 101 which forms the surface 122.

Figure 11:
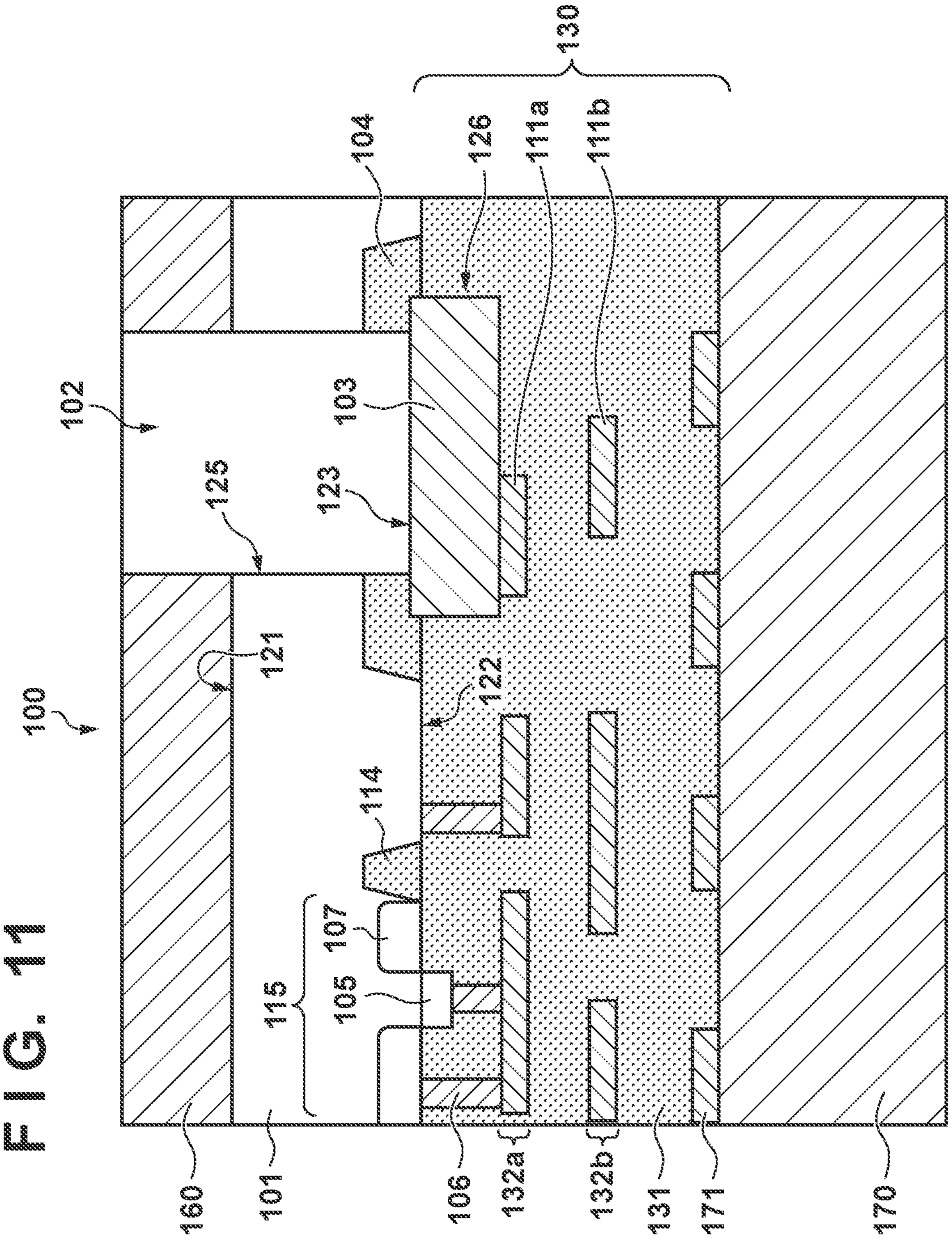
FIG. 11 is a sectional view showing an arrangement example of the semiconductor device shown in FIG. 1.

FIG. 11 is a sectional view showing a modification of the semiconductor device 100 shown in FIG. 2, and showing the vicinity of the pad 103 taken along the line A-B shown in FIG. 1, as in FIG. 2. In the arrangement shown in FIG. 11, the semiconductor device 100 further includes a substrate 170 stacked on the semiconductor layer 101 via the wiring structure 130. As has been described above, in a case in which the semiconductor device 100 includes the pixel region 200 with the pixel 201 arranged therein, an optical functional layer 160 may be arranged so as to cover the surface 121 as shown in FIG. 11. Points different from the arrangement shown in FIG. 2 will be mainly described below, and a description of the arrangement that may be similar to the arrangement shown in FIG. 2 will be omitted, as appropriate.

For example, the substrate 170 may function as a support substrate for supporting the semiconductor layer 101 and the wiring structure 130 in the semiconductor device 100. In this case, an appropriate material such as a metal, a semiconductor, plastic, or the like having an appropriate strength can be used for the substrate 170. Further, for example, an element 171 for operating a semiconductor element (for example, the transistor 115, or an element included in the pixel 201 arranged in the pixel region 200) arranged in the semiconductor layer 101 may be arranged in the semiconductor 170. In this case, a semiconductor substrate made of silicon or the like may be used as the substrate 170.

In a case in which the semiconductor device 100 includes the pixel 201 arranged in the pixel region 200, and the pixel 201 includes a photoelectric conversion element, a lens for condensing light to the photoelectric conversion element, a color filter for transmitting appropriate light to the photoelectric conversion element, or the like can be arranged as the optical functional layer 160. In a case in which the pixel 201 includes a light emitting element, a lens for condensing or diffusing light emitted by the light emitting element, a color filter for transmitting appropriate light of the light emitted by the light emitting element, or the like can be arranged as the optical functional layer 160. In either case, an anti-reflection layer or the like may be arranged as the optical functional layer 160.

Also in the arrangement shown in FIG. 11, diffusion of moisture from the opening portion 102 via the insulator 131 of the wiring structure 130 can be suppressed. Accordingly, the necessity of providing a ring structure using a metal or the like around each opening portion 102 decreases. As a result, in the semiconductor device 100, the mounting density can be improved while ensuring the reliability.

Figure 12:
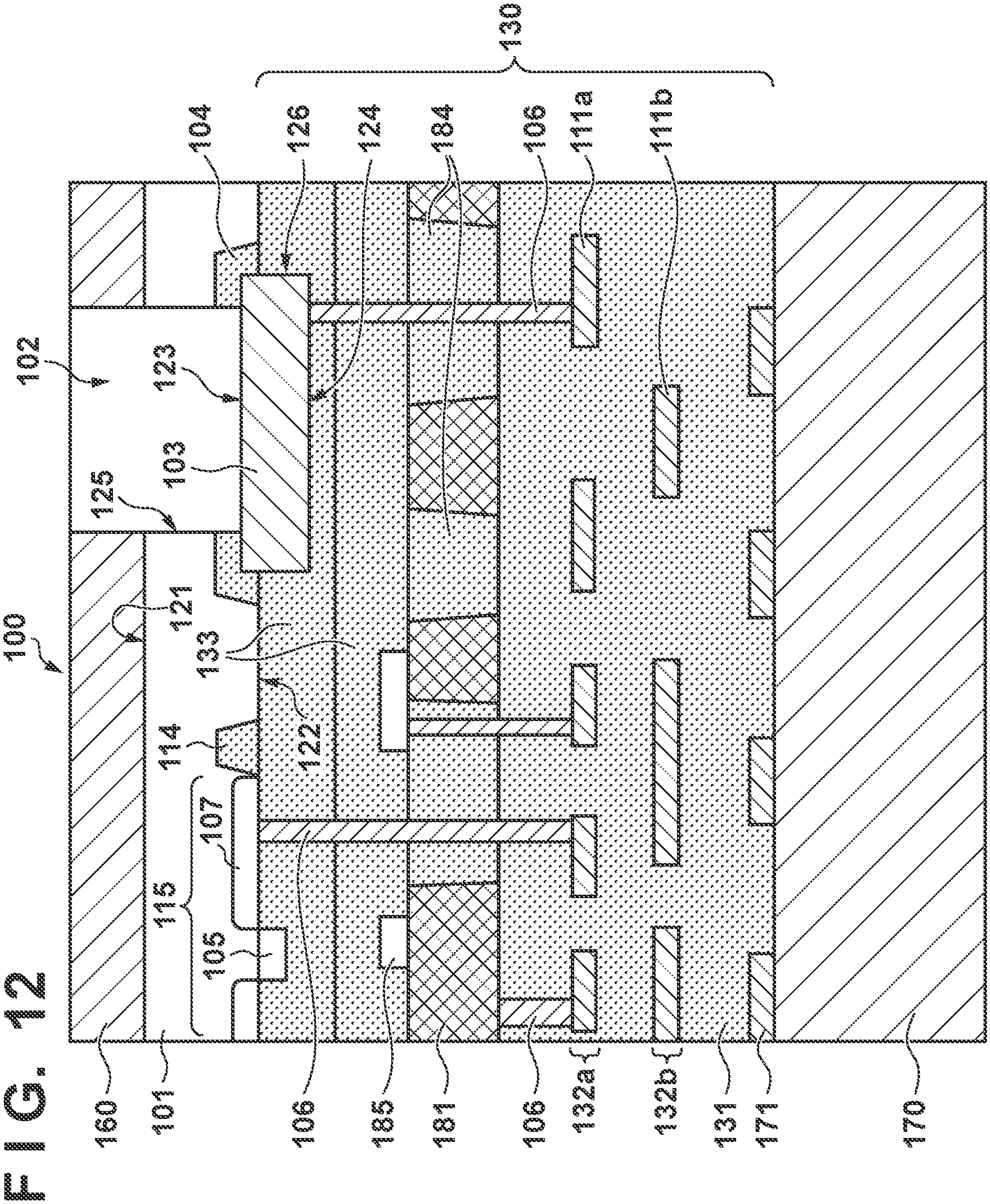
FIG. 12 is a sectional view showing an arrangement example of the semiconductor device shown in FIG. 1.

FIG. 12 is a sectional view showing a modification of the semiconductor device 100 shown in FIG. 11, and showing the vicinity of the pad 103 taken along the line A-B shown in FIG. 1, as in FIG. 11. In the arrangement shown in FIG. 12, the wiring structure 130 may include a semiconductor layer 181 different from the semiconductor layer 101. In the arrangement shown in FIG. 12, the semiconductor layer 181 and an insulator 133 are arranged between the insulator 131 and the semiconductor layer 101 shown in FIG. 11. Points different from the arrangement shown in FIG. 11 will be mainly described below, and a description of the arrangement that may be similar to the arrangement shown in FIG. 11 will be omitted, as appropriate.

For example, a semiconductor such as silicon can be used for the semiconductor layer 181. Further, for example, an element 185 for operating a semiconductor element (for example, the transistor 115, or an element included in the pixel 201 arranged in the pixel region 200) arranged in the semiconductor layer 101 may be arranged in the semiconductor layer 181.

In the arrangement shown in FIG. 12, the semiconductor layer 101 and the semiconductor layer 181 are stacked on each other via the insulator 133 forming a part of the wiring structure 130. An appropriate insulating material such as silicon oxide, silicon nitride, or silicon oxynitride can be used for the insulator 133. In the arrangement shown in FIG.

12, a case is shown in which the insulator 133 has a two-layer structure, but three or more insulating films may be stacked. In the insulator 133, insulating films of different kinds may be stacked, or insulating films of the same kind may be stacked.

The wiring layer 132a closest to the surface 122 among the wiring layers 132 arranged in the wiring structure 130 is arranged between the semiconductor layer 181 and the substrate 170. Therefore, the pad 103 and the wiring pattern 111a arranged in the wiring layer 132a may be connected via the conductive pattern 106. An insulating portion 184 may be provided in the semiconductor layer 181 in the portion where the conductive pattern 106 extends through the semiconductor layer 181. With this, the semiconductor layer 181 and the conductive pattern 106 are electrically insulated. The insulating portion 184 can be formed using various known processes.

Also in the arrangement shown in FIG. 12, diffusion of moisture from the opening portion 102 via the insulator 131 of the wiring structure 130 can be suppressed. Accordingly, the necessity of providing a ring structure using a metal or the like around each opening portion 102 decreases. As a result, in the semiconductor device 100, the mounting density can be improved while ensuring the reliability.

Figure 13:
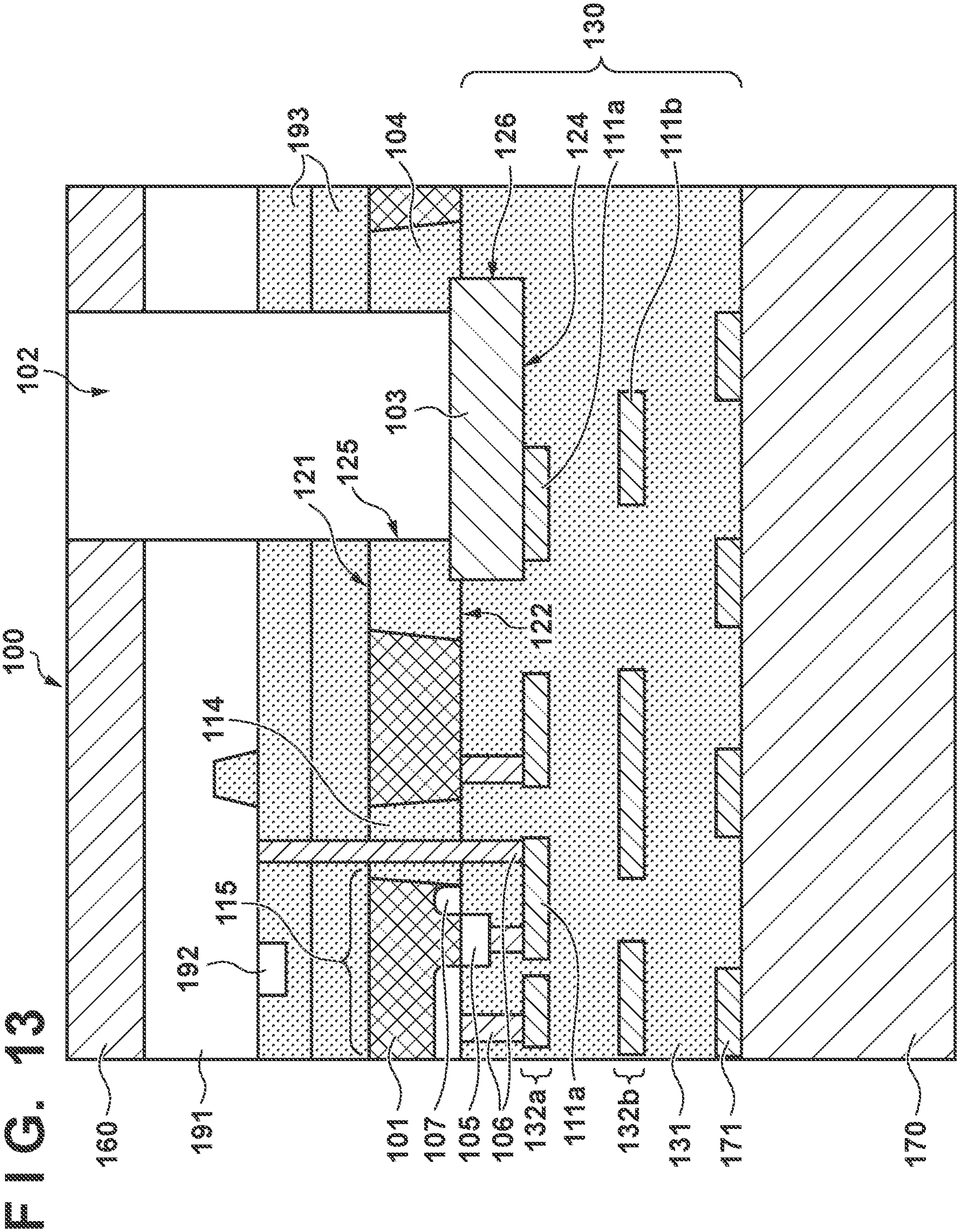
FIG. 13 is a sectional view showing an arrangement example of the semiconductor device shown in FIG. 1.

FIG. 13 is a sectional view showing a modification of the semiconductor device 100 shown in FIG. 12, and showing the vicinity of the pad 103 taken along the line A-B shown in FIG. 1, as in FIG. 12. In the arrangement shown in FIG. 13, the semiconductor device 100 further includes a semiconductor layer 191, which is different from the semiconductor layer 101, so as to cover the surface 121. The semiconductor layer 101 and the semiconductor layer 191 are stacked on each other via an insulator 193. Points different from the arrangement shown in FIG. 12 will be mainly described below, and a description of the arrangement that may be similar to the arrangement shown in FIG. 12 will be omitted, as appropriate.

In the arrangement shown in FIG. 13, an element 192 such as a semiconductor element is arranged in the semiconductor layer 191. For example, the pixel region 200 with the pixel 201 arranged therein may be arranged in the semiconductor layer 191, and the element 192 may form a part of the pixel 201. The pixel 201 arranged in the semiconductor layer 191 may be operated by, for example, a semiconductor element such as the transistor 115 arranged in the semiconductor layer 101. A semiconductor such as silicon can be used for the semiconductor layer 191. An appropriate insulating material such as silicon oxide, silicon nitride, or silicon oxynitride can be used for the insulator 193.

In the arrangement shown in FIG. 13, in order to electrically connect the semiconductor layer 191 and the wiring pattern 111 included in the wiring layer 132 arranged in the wiring structure 130, the element separation portion 114 can be formed so as to extend through the semiconductor layer 101 by using a known process. In a case in which the insulating portion 104 and the element separation portion 114 are simultaneously formed using the same process, or the like, the insulating portion 104 can extend through the semiconductor layer 101 from the surface 121 to the surface 122. In this case, the insulating portion 104 forms the wall surface 125 of the opening portion 102 open from the surface 121 to the pad 103.

In the arrangement shown in FIG. 13, moisture can be diffused to the semiconductor element from the opening portion 102 via the insulator 193. However, for example, as shown in FIG. 13, the conductive pattern 106 is arranged in the insulator 193 in a direction intersecting the surface 122, and the wiring layer 132 including the wiring pattern 111 extending in a direction along the surface 122 may not be arranged therein. With this, it is possible to make the insulator 193 thinner than the wiring structure 130, and intrusion of moisture can be suppressed. Accordingly, also in the arrangement shown in FIG. 13, the necessity of providing a ring structure using a metal or the like around each opening portion 102 decreases. As a result, in the semiconductor device 100, the mounting density can be improved while ensuring the reliability.

Figure 14:
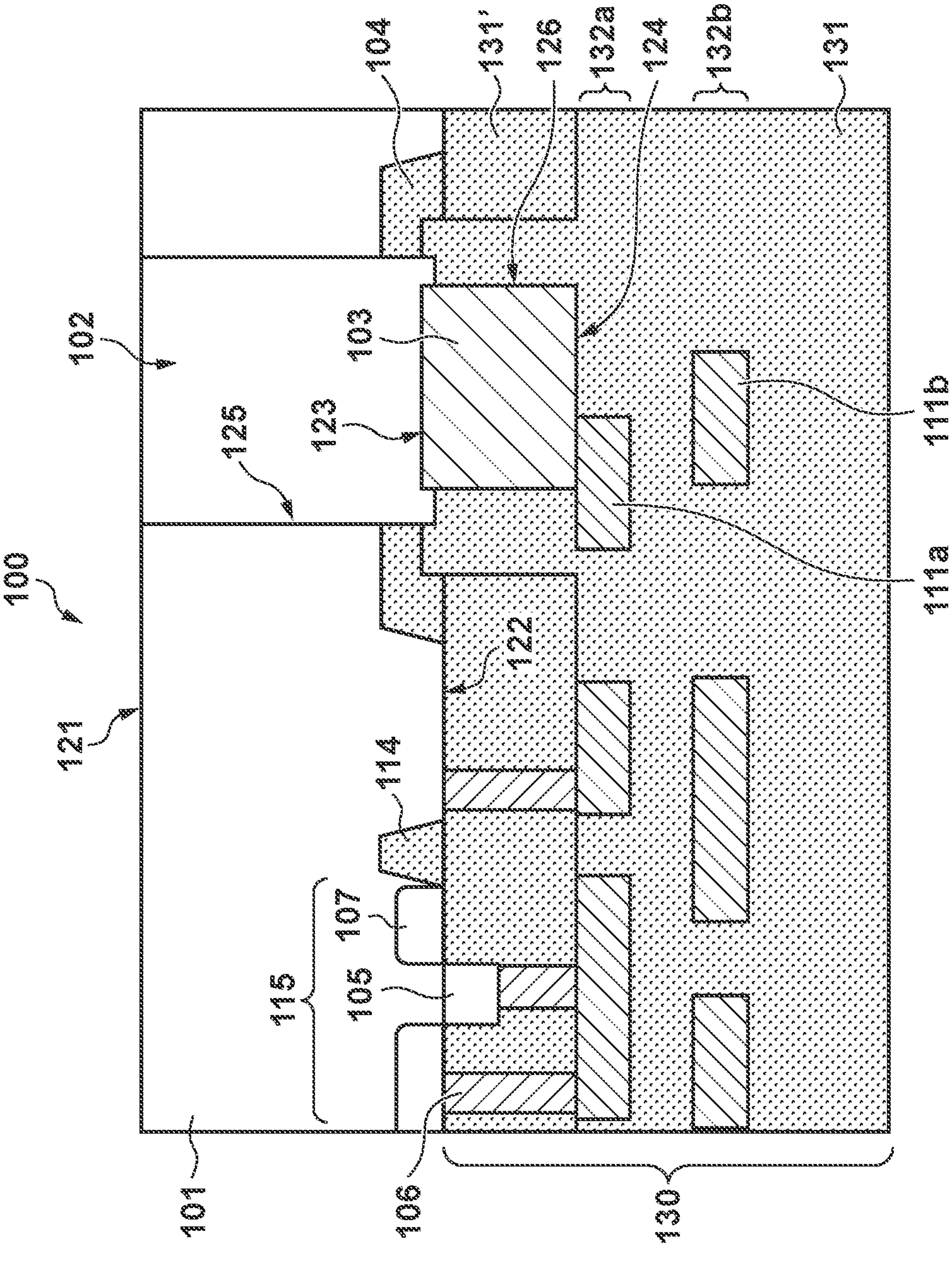
FIG. 14 is a sectional view showing an arrangement example of the semiconductor device shown in FIG. 1.

In each arrangement described above, in the orthogonal projection with respect to the surface 121, the outer edge of the insulating portion 104 is arranged so as to surround the outer edge of the pad 103, and the outer edge of the pad 103 is arranged so as to surround the outer edge (wall surface 125) of the opening portion 102. However, the arrangement relationship among the opening portion 102, the pad 103 and the insulating portion 104 is not limited to this. FIG. 14 is a sectional view showing a modification of the semiconductor device 100 shown in FIG. 2, and showing the vicinity of the pad 103 taken along the line A-B shown in FIG. 1, as in FIG. 2.

Also in the arrangement shown in FIG. 14, in the orthogonal projection with respect to the surface 121, the outer edge of the insulating portion 104 is arranged so as to surround the wall surface 125 of the opening portion 102. On the other hand, as shown in FIG. 14, in the orthogonal projection with respect to the surface 121, the wall surface 125 of the opening portion 102 may be arranged so as to surround the outer edge of the pad 103.

By using an example of steps to be described later, as shown in FIG. 14, a part of the side surface 126 connecting the surface 123 as the upper surface of the pad 103 and the surface 124 on the opposite side of the surface 123 can be exposed to the opening portion 102, and the remaining part of the side surface 126 can be in contact with the wiring structure 130. Further, as will be described in the example of steps of the manufacturing method of the semiconductor device 100 to be described later, the wiring structure 130 can include the insulator 131 with the wiring layer 132 arranged therein, and an insulator 131'. An appropriate insulating material such as silicon oxide, silicon nitride, or silicon oxynitride can be used for the insulators 131 and 131'. The remaining arrangement may be similar to the arrangement shown in FIG. 2 described above, and a description thereof will be omitted here.

With reference to FIGS. 15 to 18, an example of steps of the manufacturing method in the vicinity of the pad 103 of the semiconductor device 100 shown in FIG. 14 will be described. The sectional view in the step to be described below is obtained by vertically reversing the sectional view shown in FIG. 14.

Figure 15:
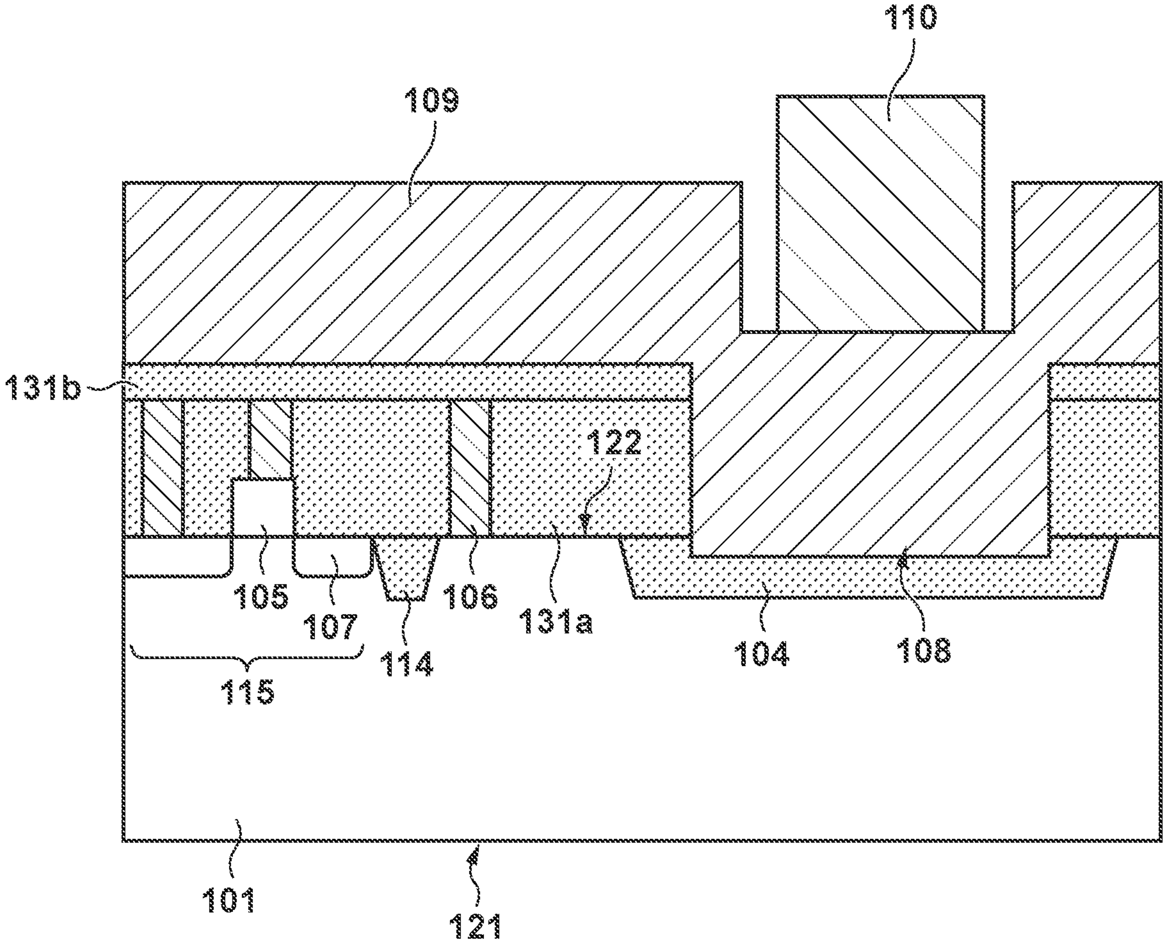
FIG. 15 is a sectional view showing an example of steps of a manufacturing method of the semiconductor device shown in FIG. 14.

First, steps similar to the steps shown in FIGS. 3 to 5 described above are performed. Then, as shown in FIG. 15, the resist film 110 is formed on the conductive film 109. Unlike the case shown in FIG. 6, the resist film 110 is formed in a region inside the wall surface of the groove 108.

Figure 16:
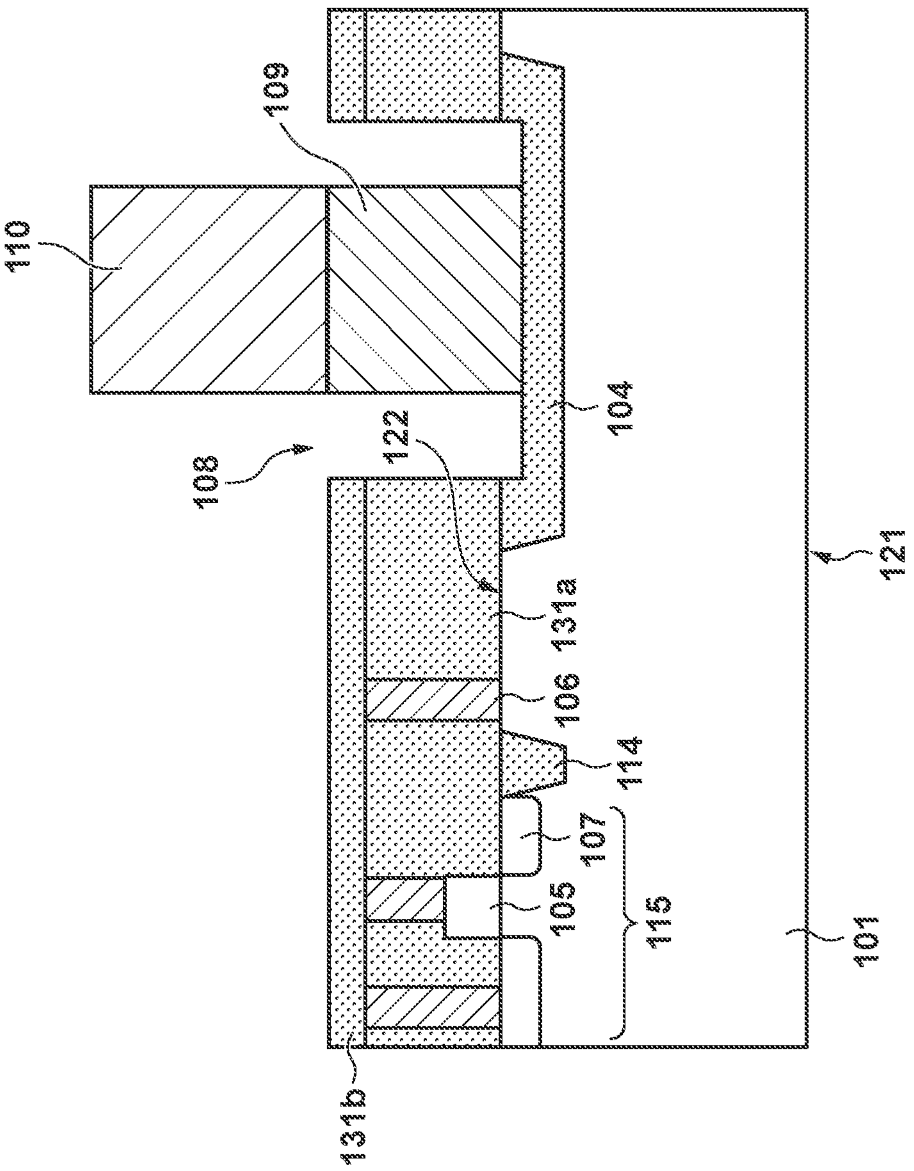
FIG. 16 is a sectional view showing the example of steps of the manufacturing method of the semiconductor device shown in FIG. 14.

After the resist film 110 is formed, as shown in FIG. 16, the conductive film 109 is etched. With this step, the portion of the conductive film 109 covered with the resist film 110 and arranged inside the groove 108 is left.

Figure 17:
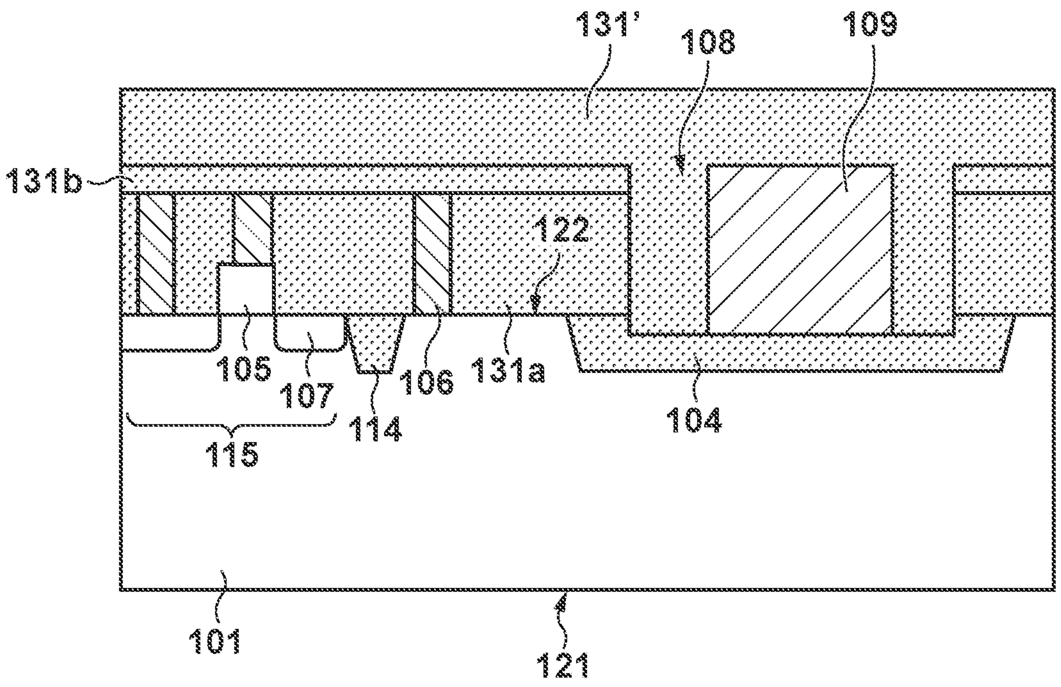
FIG. 17 is a sectional view showing the example of steps of the manufacturing method of the semiconductor device shown in FIG. 14.

After the conductive film 109 is patterned and the resist film 110 is removed, the insulator 131' is formed as shown in FIG. 17. For example, the material of the insulator 131' is deposited on the insulators 131a and 131b so as to fill a space between the conductive film 109 arranged in the groove 108 and the insulators 131a and 131b, and then the surface is planarized by a CMP process. With this, the insulator 131' that forms a part of the wiring structure 130 in a subsequent step can be formed as shown in FIG. 17. The space between the conductive film 109 arranged in the groove 108 and the insulators 131*a* and 131*b* may be completely filled as shown in FIG. 17, or a gap may partially exist.

Figure 18:
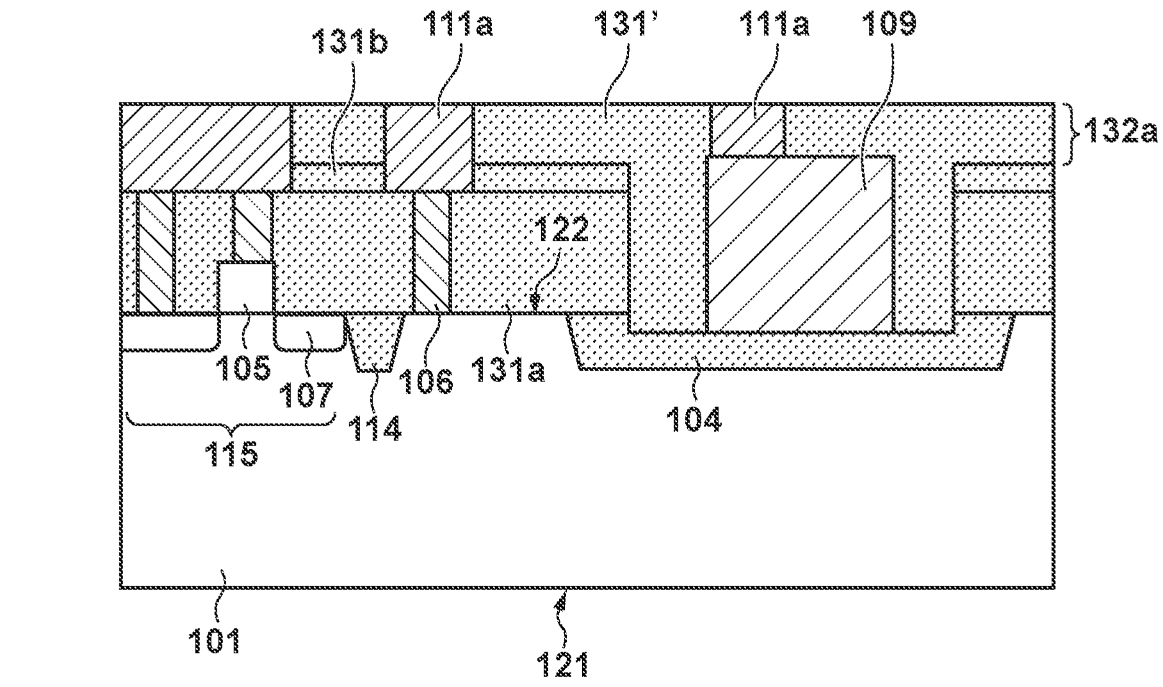
FIG. 18 is a sectional view showing the example of steps of the manufacturing method of the semiconductor device shown in FIG. 14.

Then, as shown in FIG. 18, the wiring pattern 111*a* of the wiring layer 132*a* closest to the surface 122 among the wiring layers 132 arranged in the wiring structure 130 is formed. With respect to the arrangement shown in FIG. 18, the wiring layer 132*b* with the wiring pattern 111*b* arranged therein, and the like are further formed. Further, the opening portion 102 extending from the surface 121 to the conductive film 109 is formed. With these steps, as shown in FIG. 14, the semiconductor device 100 in which the conductive film 109 functions as the pad 103 is manufactured.

When forming the opening portion 102, first, an opening portion extending through the semiconductor layer 101 is provided. Then, the insulating portion 104 and the insulators 131 and 131' May be etched. When etching the insulating portion 104 and the insulators 131 and 131', a resist film used when extending through the semiconductor layer 101 may be used, or the opening portion formed in the semiconductor layer 101 may be used as a mask. In the arrangement shown in FIG. 14, an example is shown in which, when etching the insulating portion 104 and the insulators 131 and 131', the side surface 126 of the pad 103 is exposed to the opening portion 102 by over-etching the insulating portion 104 and the insulators 131 and 131' after the conductive film 109 (pad 103) is exposed. However, the present invention is not limited to this. By adjusting the over-etching amount, the entire side surface 126 of the pad 103 may be in contact with the wiring structure 130 without exposing the side surface 126 of the pad 103 to the opening portion 102.

Figure 19:
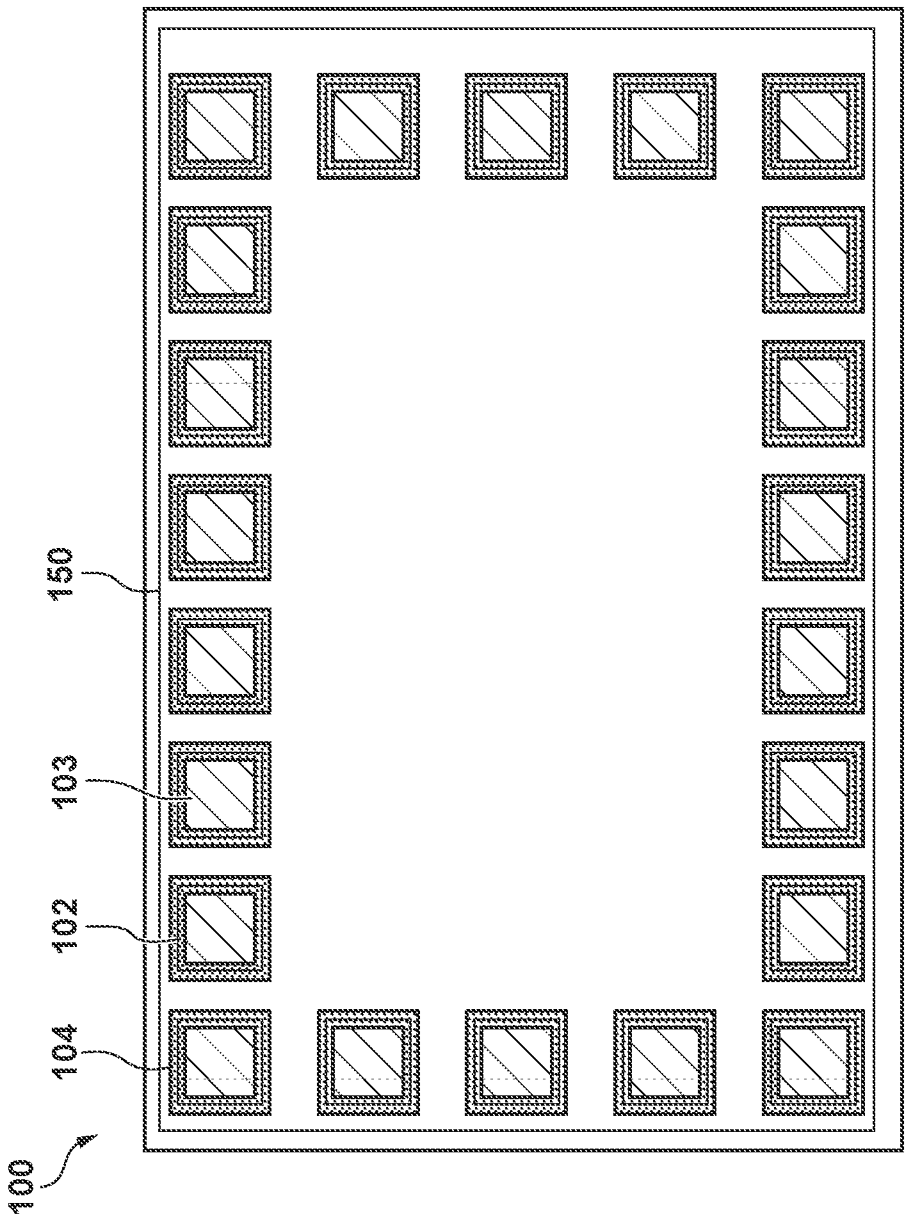
FIG. 19 is a plan view showing an arrangement example of the semiconductor device shown in FIG. 14.
Figure 20:
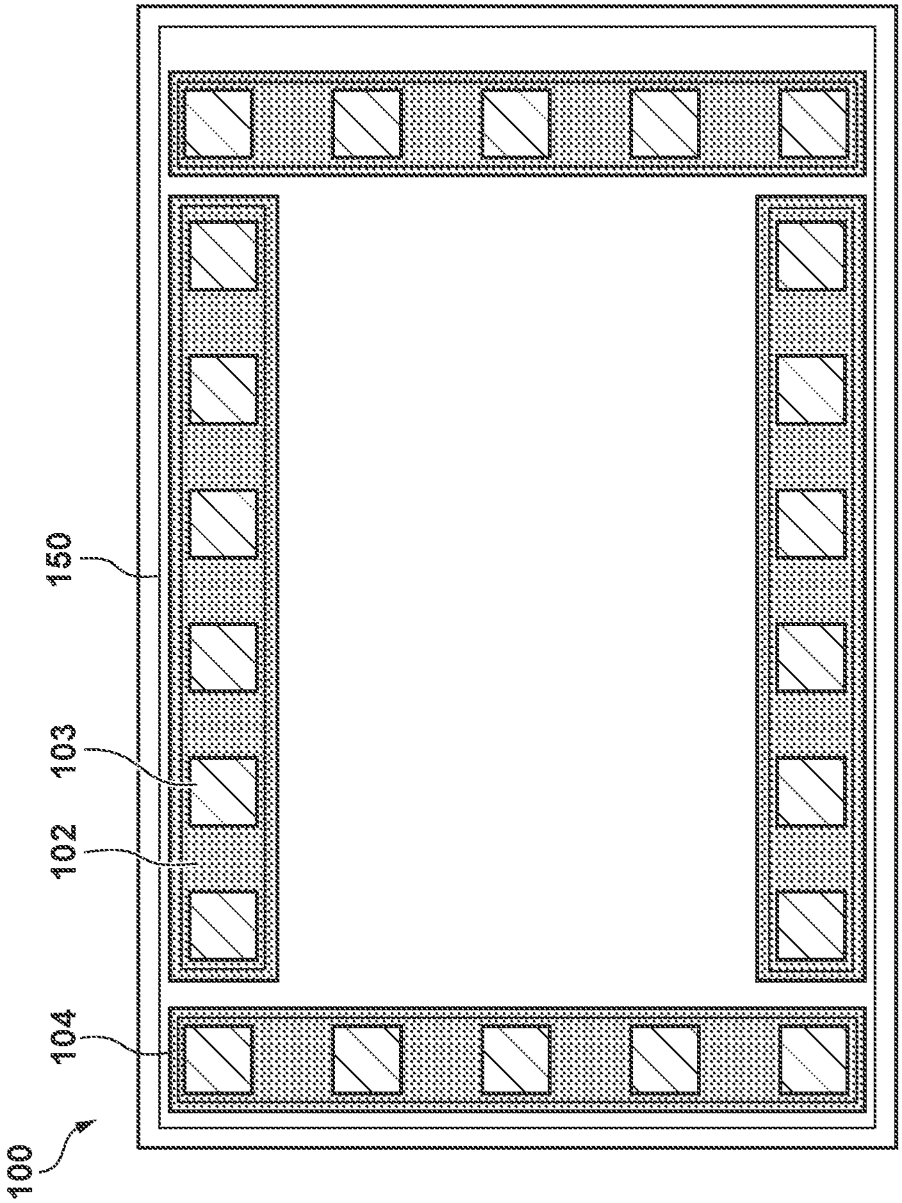
FIG. 20 is a plan view showing an arrangement example of the semiconductor device shown in FIG. 14.

Here, with reference to FIGS. 19 and 20, the arrangement of the opening portion 102, the pad 103, and the insulating portion 104 arranged in the semiconductor device 100 will be described. Similar to FIGS. 9 and 10, FIGS. 19 and 20 are views for explaining the arrangement of the opening portion 102, the pad 103, and the insulating portion 104, so that the components of the semiconductor device 100 other than the opening portion 102, the pad 103, and the insulating portion 104 are not illustrated, as appropriate. Each of FIGS. 19 and 20 is a plan view of the semiconductor device 100, which has the sectional structure shown in FIG. 14, observed from the surface 121 side.

As shown in FIGS. 19 and 20, in the orthogonal projection with respect to the surface 121, the outer edge of the insulating portion 104 is arranged so as to surround the outer edge (wall surface 125) of the opening portion 102. Further, in the orthogonal projection with respect to the surface 121, the outer edge (wall surface 125) of the opening portion 102 is arranged so as to surround the pad 103. In the arrangement shown in FIG. 19, one pad 103 is arranged in one insulating portion 104. On the other hand, in the arrangement shown in FIG. 20, the plurality of pads 103 are arranged in one insulating portion 104. The number of the pads 103 arranged in one insulating portion 104 may be decided in accordance with the process of forming the insulating portion 104 on the surface of the semiconductor layer 101 which forms the surface 122.

Also in the arrangement shown in FIG. 14, diffusion of moisture from the opening portion 102 via the insulator 131 of the wiring structure 130 can be suppressed. Accordingly, the necessity of providing a ring structure using a metal or the like around each opening portion 102 decreases. As a result, in the semiconductor device 100, the mounting density can be improved while ensuring the reliability.

In the arrangement described with reference to FIGS. 14 to 20, the opening portion 102 is formed larger than the pad 103. Therefore, the visibility of the pad 103 during performing external connection processing of the pad 103 by using wire bonding or the like improves. The arrangement in the vicinity of the pad 103 shown in FIG. 14 May be applied to the stacked structure described with reference to FIGS. 11 to 13 described above.

Figure 21:
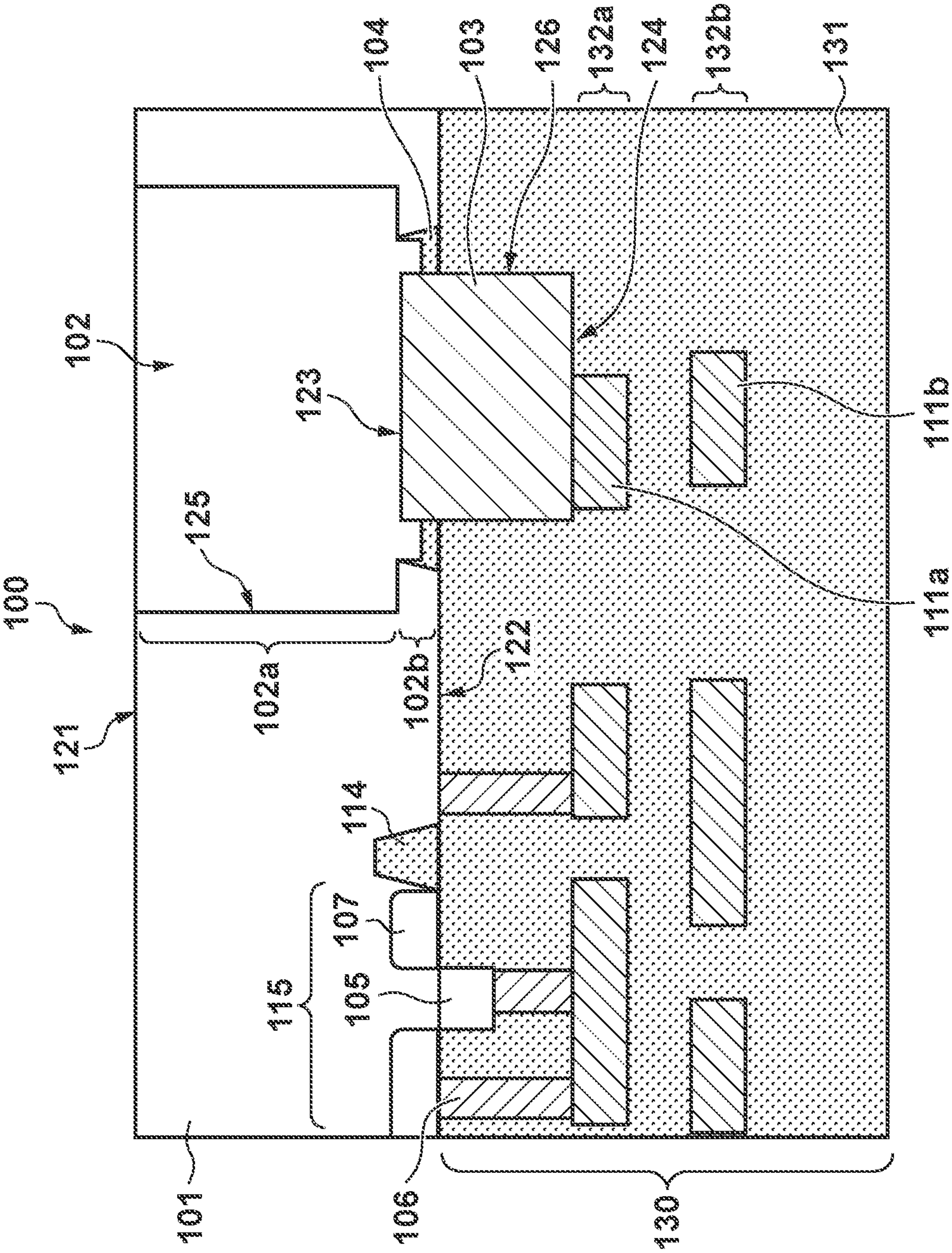
FIG. 21 is a sectional view showing an arrangement example of the semiconductor device shown in FIG. 1.

FIG. 21 is a sectional view showing a modification of the semiconductor devices 100 shown in FIGS. 2 and 14, and showing the vicinity of the pad 103 taken along the line A-B shown in FIG. 1, as in FIGS. 2 and 14. In the arrangement shown in FIG. 21, in the orthogonal projection with respect to the surface 121, as in the arrangement shown in FIG. 14, the wall surface 125 of the opening portion 102 is arranged so as to surround the outer edge of the pad 103. Further, in the orthogonal projection with respect to the surface 121, the opening portion 102 may include a portion 102*a*, and a portion 102*b* arranged between the portion 102*a* and the pad 103 and different from the portion 102*a* in the opening area. In this case, in the orthogonal projection with respect to the surface 121, the wall surface of the portion 102*a* of the wall surface 125 of the opening portion 102 can be arranged so as to surround the outer edge of the insulating portion 104. On the other hand, in the orthogonal projection with respect to the surface 121, the wall surface of the portion 102*b* of the wall surface 125 of the opening portion 102 may be arranged between the outer edge of the insulating portion 104 and the outer edge of the pad 103.

By using an example of steps to be described later, as shown in FIG. 21, a part of the side surface 126 connecting the surface 123 as the upper surface of the pad 103 and the surface 124 on the opposite side of the surface 123 can be exposed to the opening portion 102, and the remaining part of the side surface 126 can be in contact with the insulating portion 104 and the wiring structure 130.

Figure 22:
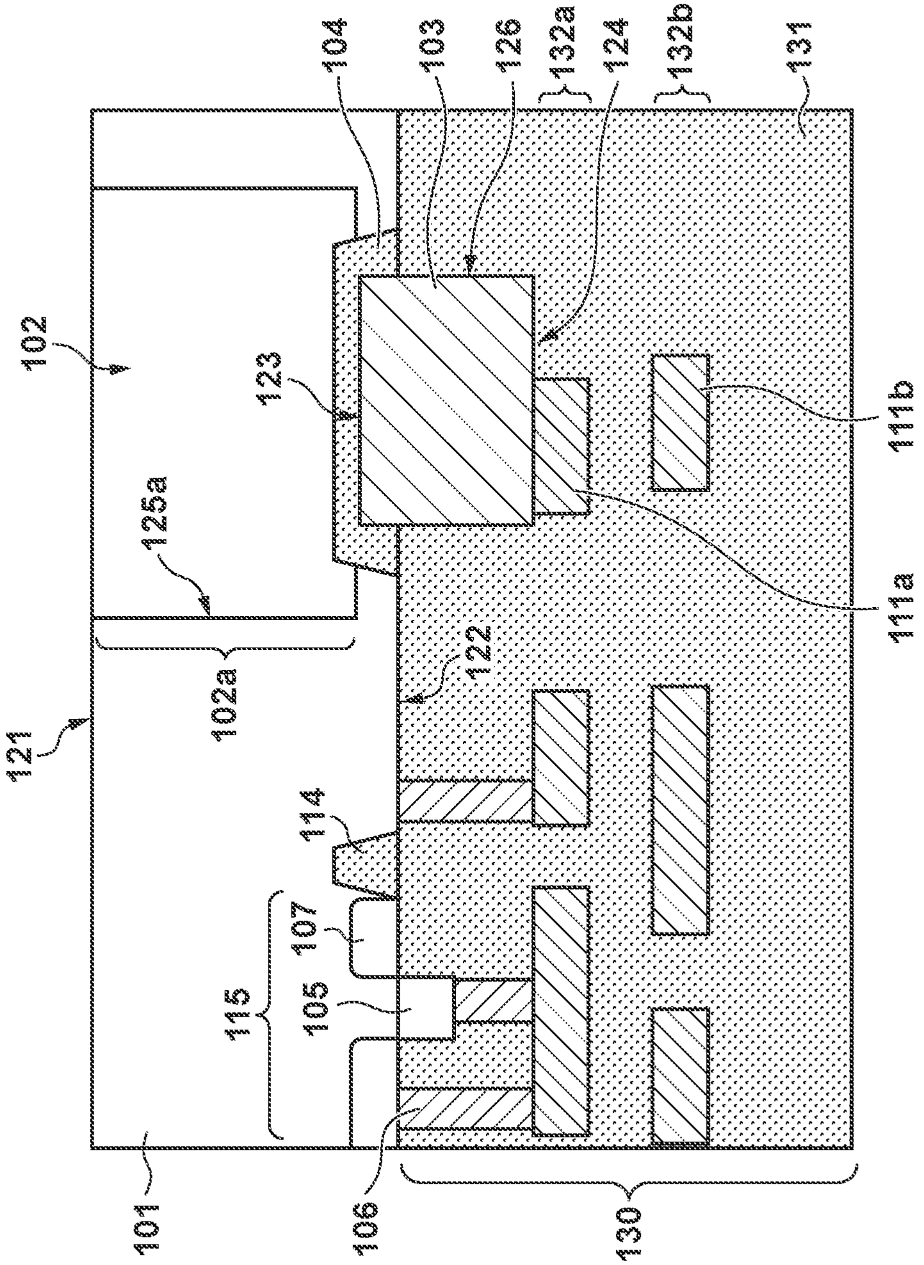
FIG. 22 is a sectional view showing an example of steps of a manufacturing method of the semiconductor device shown in FIG. 21.

With reference to FIG. 22, an example of steps of the manufacturing method in the vicinity of the pad 103 of the semiconductor device 100 shown in FIG. 21 will be described. Steps before forming the opening portion 102 may be similar to the steps in formation of the semiconductor device 100 shown in each of FIGS. 2 and 14 described above. Therefore, the step of forming the opening portion 102 will be mainly described, and steps which may be similar to the steps in formation of the semiconductor device 100 shown in each of FIGS. 2 and 14 will be omitted here.

In each arrangement described above, when forming the opening portion 102, for example, a mask pattern or the like is arranged so as to arrange the wall surface 125 of the opening portion 102 inside the outer edge of the insulating portion 104, and etching is performed. On the other hand, in order to obtain the arrangement shown in FIG. 21 described above, first, the semiconductor layer 101 is etched to form the opening portion 102 by using a mask pattern used to arrange the outer edge of the opening outside the outer edge of the insulating portion 104. Etching of the semiconductor layer 101 may be finished when the insulating portion 104 is exposed. With this, as shown in FIG. 22, the portion 102*a* of the opening portion 102 in which the wall surface 125 is arranged so as to surround the outer edge of the insulating portion 104 is formed.

Then, by etching the insulating portion 104 until the pad 103 is exposed, the opening portion 102 (portion 102*b*) is formed as shown in FIG. 21. When etching the insulating portion 104, the portion 102*a* of the opening portion 102 may be used as a mask. In the arrangement shown in FIG. 21, an example is shown in which, when etching the insulating portion 104, the side surface 126 of the pad 103 is exposed to the opening portion 102 by over-etching the insulating portion 104 after the pad 103 is exposed. However, the present invention is not limited to this. By adjusting the over-etching amount, the entire side surface 126 of the pad 103 may be in contact with the insulating portion 104 and the wiring structure 130 without exposing the side surface 126 of the pad 103 to the opening portion 102.

Here, with reference to FIGS. 23 and 24, the arrangement of the portion 102*a* of the opening portion 102, the pad 103, and the insulating portion 104 arranged in the semiconductor device 100 will be described. Similar to FIGS. 9 and 10 and FIGS. 19 and 20 described above, FIGS. 23 and 24 are views for explaining the arrangement of the opening portion 102, the pad 103, and the insulating portion 104, so that the components of the semiconductor device 100 other than the portion 102*a* of the opening portion 102, the pad 103, and the insulating portion 104 are not illustrated, as appropriate. Each of FIGS. 23 and 24 is a plan view of the semiconductor device 100, which has the sectional structure shown in FIG. 21, observed from the surface 121 side.

Figure 23:
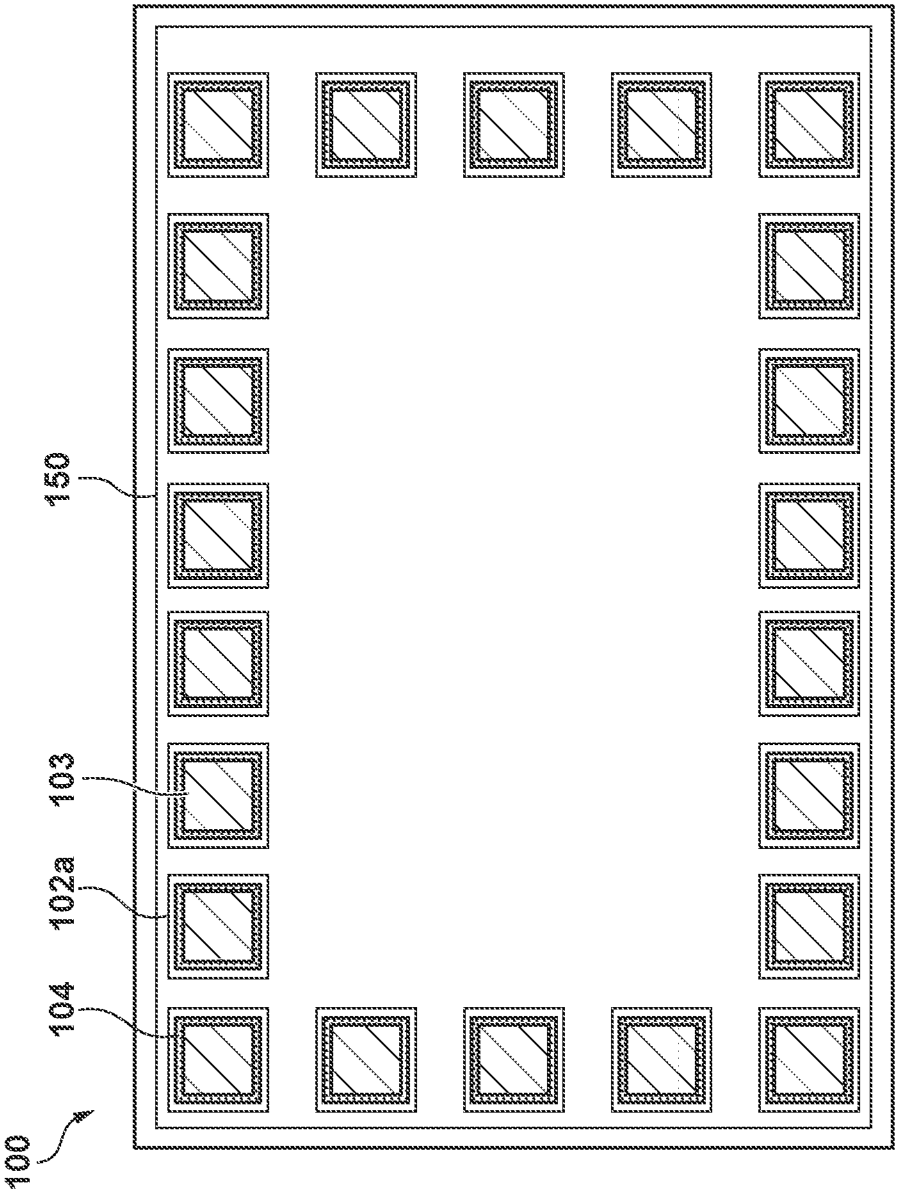
FIG. 23 is a plan view showing an arrangement example of the semiconductor device shown in FIG. 21.
Figure 24:
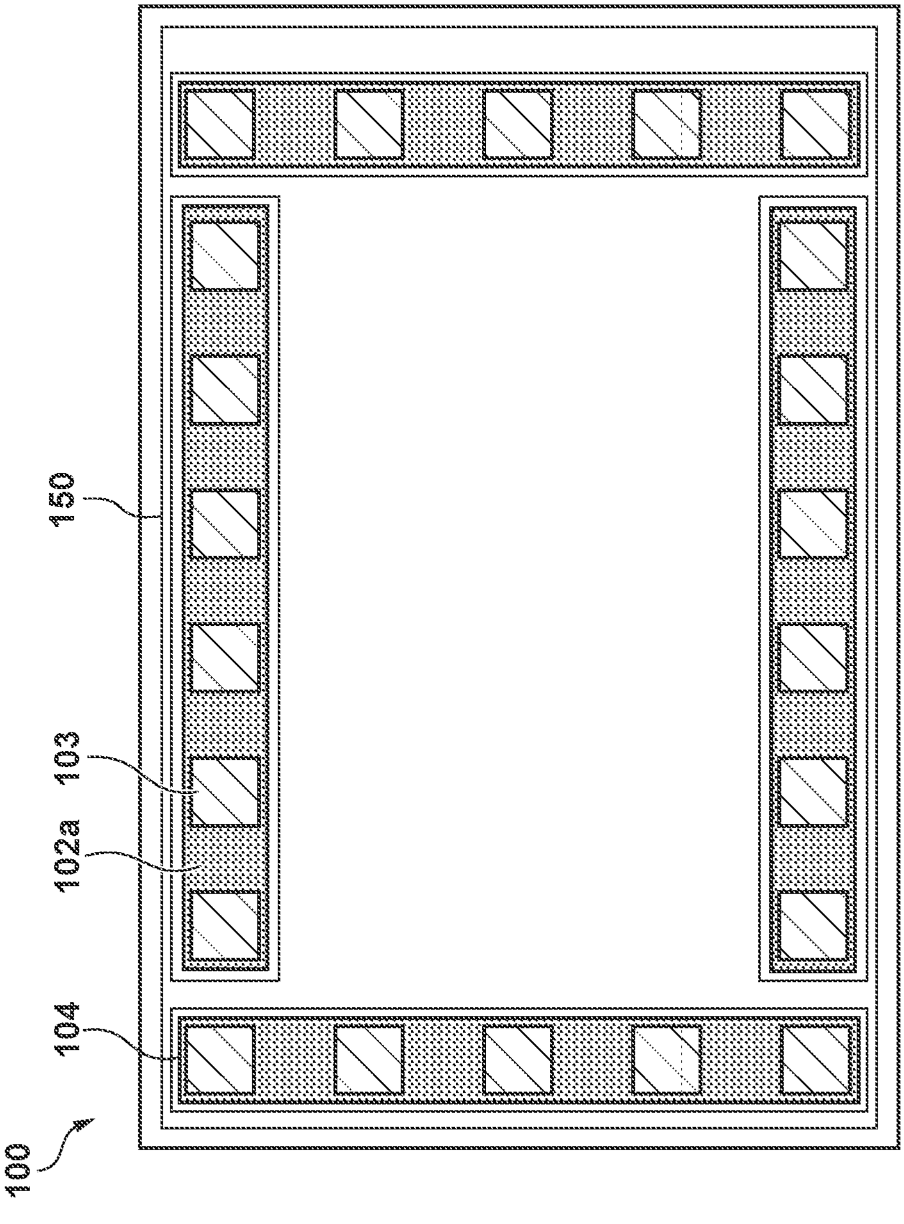
FIG. 24 is a plan view showing an arrangement example of the semiconductor device shown in FIG. 21.

As shown in FIGS. 23 and 24, in the orthogonal projection with respect to the surface 121, the outer edge of the portion 102*a* of the opening portion 102 (the wall surface of the portion 102*a* of the wall surface 125 of the opening portion 102) is arranged so as to surround the outer edge of insulating portion 104. Further, in the orthogonal projection with respect to the surface 121, the outer edge of the insulating portion 104 is arranged so as to surround the pad 103. In the arrangement shown in FIG. 23, one pad 103 is arranged in one insulating portion 104. On the other hand, in the arrangement shown in FIG. 24, a plurality of the pads 103 are arranged in one insulating portion 104. The number of the pads 103 arranged in one insulating portion 104 may be decided in accordance with the process of forming the insulating portion 104 on the surface of the semiconductor layer 101 which forms the surface 122.

Also in the arrangement shown in FIG. 21, diffusion of moisture from the opening portion 102 via the insulator 131 of the wiring structure 130 can be suppressed. Accordingly, the necessity of providing a ring structure using a metal or the like around each opening portion 102 decreases. As a result, in the semiconductor device 100, the mounting density can be improved while ensuring the reliability.

In the arrangement described with reference to FIGS. 21 to 23, the opening portion 102 is formed larger than the pad 103. Further, the portion 102*a* of the opening portion 102 is formed larger than the insulating portion 104. Therefore, the visibility of the pad 103 during performing external connection processing of the pad 103 by using wire bonding or the like improves. The arrangement in the vicinity of the pad 103 shown in FIG. 21 May be applied to the stacked structure described with reference to FIGS. 11 to 13 described above.

Figure 25:
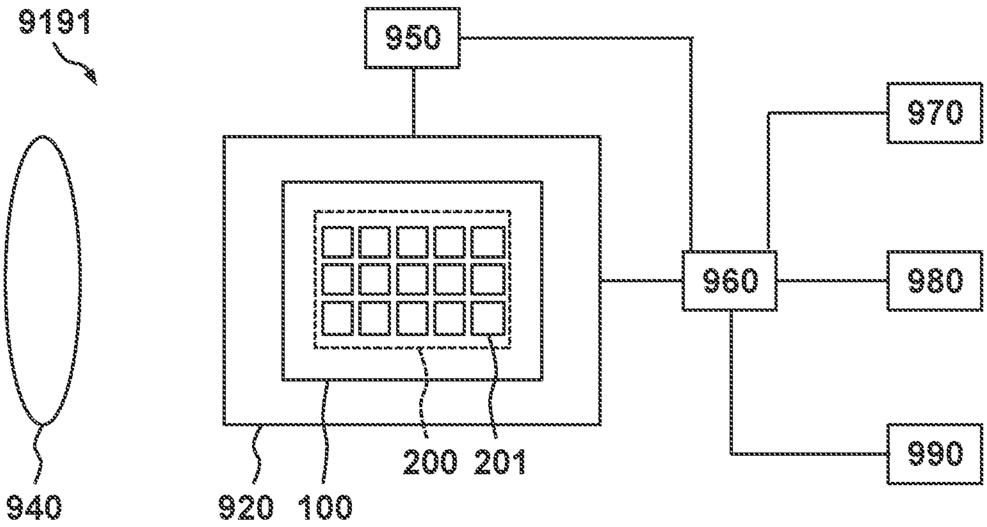
FIG. 25 is a view showing an arrangement example of an apparatus embedded with the semiconductor device shown in FIG. 1.

Here, with reference to FIG. 25, an application example of the semiconductor device 100 according to this embodiment will be described. FIG. 25 is a schematic view of an apparatus 9191 including the semiconductor device 100. Here, it will be described that the semiconductor device 100 includes the pixel region 200 with the pixel 201 arranged therein. Further, a case will be described in which a photoelectric conversion element is arranged in each pixel 201. That is, the semiconductor device 100 is a so-called photoelectric conversion device. The semiconductor device 100 can also be called an image capturing device. In the apparatus 9191, the semiconductor device 100 is accommodated in a package 920. The apparatus 9191 can include at least one of an optical device 940, a control device 950, a processing device 960, a display device 970, a storage device 980, and a mechanical device 990. However, the semiconductor device 100 arranged in the apparatus 9191 is not limited to the photoelectric conversion device, and may function as a light emitting device, a processing device, a storage device, or the like as has been described above. The apparatus 9191 only needs to include, for example, the semiconductor device 100, and a processing device (a processing device different from the semiconductor device 100 if the semiconductor device 100 functions as a processing device) that processes a signal output from the semiconductor device 100.

The apparatus 9191 including the semiconductor device 100 functioning as a photoelectric conversion device shown in FIG. 25 will be described below in detail. The package 920 can include a base on which the semiconductor device 100 is fixed, and a cover made of glass or the like facing the semiconductor device 100. The package 920 can further include a joining member such as a bonding wire and bump for connecting a terminal of the base and the pad 103 of the semiconductor device 100.

The apparatus 9191 can include at least one of the optical device 940, the control device 950, the processing device 960, the display device 970, the storage device 980, and the mechanical device 990. The optical device 940 is implemented by, for example, a lens, a shutter, and a mirror. The control device 950 controls the semiconductor device 100. The control device 950 is, for example, a semiconductor device such as an ASIC.

The processing device 960 processes a signal output from the semiconductor device 100. The processing device 960 is a semiconductor device such as a CPU or an ASIC for forming an analog front end (AFE) or a digital front end (DFE). The display device 970 is an EL display device or a liquid crystal display device that displays information (image) obtained by the semiconductor device 100 functioning as a photoelectric conversion device. The storage device 980 is a magnetic device or a semiconductor device that stores the information (image) obtained by the semiconductor device 100. The storage device 980 is a volatile memory such as an SRAM or a DRAM, or a nonvolatile memory such as a flash memory or a hard disk drive.

The mechanical device 990 includes a moving or propulsion unit such as a motor or an engine. In the apparatus 9191, the signal output from the semiconductor device 100 is displayed on the display device 970 or transmitted to an external device by a communication device (not shown) included in the apparatus 9191. Hence, the apparatus 9191 May further include the storage device 980 and the processing device 960 in addition to the memory circuits and arithmetic circuits included in the semiconductor device 100. The mechanical device 990 may be controlled based on the signal output from the semiconductor device 100.

In addition, the apparatus 9191 is suitable for an electronic apparatus such as an information terminal (for example, a smartphone or a wearable terminal) which has a shooting function or a camera (for example, an interchangeable lens camera, a compact camera, a video camera, or a monitoring camera). The mechanical device 990 in the camera can drive the components of the optical device 940 in order to perform zooming, an in-focus operation, and a shutter operation. Alternatively, the mechanical device 990 in the camera can move the semiconductor device 100 in order to perform an anti-vibration operation.

Furthermore, the apparatus 9191 can be a transportation apparatus such as a vehicle, a ship, or an airplane. The mechanical device 990 in the transportation apparatus can be used as a moving device. The apparatus 9191 as the transportation apparatus is suitable for a device that transports the semiconductor device 100 or a device that uses an image capturing function to assist and/or automate driving (steering). The processing device 960 for assisting and/or automating driving (steering) can perform, based on the information obtained by the semiconductor device 100, processing for operating the mechanical device 990 as a moving device. Alternatively, the apparatus 9191 May be a medical apparatus such as an endoscope, measurement apparatus such as a distance measurement sensor, an analysis apparatus such as an electron microscope, or an office apparatus such as a copy machine.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-208801, filed Dec. 26, 2022, which is hereby incorporated by reference herein in its entirety.

What is claimed is:

1. A semiconductor device comprising: a semiconductor layer, in which a semiconductor element is arranged, and which forms a part of a first surface and a part of a second surface; a wiring structure, which is arranged so as to cover the second surface, and includes, in an insulator, wiring layers each including a wiring pattern extending in a direction along the second surface; a pad for external connection; and a humidity-resistance structure configured to suppress diffusion of moisture from an end portion of the semiconductor device, wherein an opening portion for exposing the pad is provided in the first surface, the pad is arranged between the first surface and a wiring layer closest to the second surface among the wiring layers arranged in the wiring structure, and has a third surface which partially exposed by the opening portion, an insulating portion forming a part of the second surface is embedded in the semiconductor layer, a portion of the insulating portion forming the second surface is in contact with the insulator, in an orthogonal projection with respect to the first surface, an outer edge of the insulating portion is arranged so as to surround an outer edge of the pad, a wall surface of the opening portion is formed by the semiconductor layer and the insulating portion, or formed by the insulating portion, and in the orthogonal projection with respect to the first surface, the humidity-resistance structure is formed between the pad and an outer edge of the semiconductor device.

2. The device according to claim 1, wherein the opening portion is not arranged in the wiring structure.

3. The device according to claim 1, wherein the third surface is arranged between the first surface and the second surface.

4. The device according to claim 1, wherein a part of the third surface is in contact with the insulating portion.

5. The device according to claim 4, wherein in the orthogonal projection with respect to the first surface, the outer edge of the pad is arranged so as to surround the wall surface.

6. The device according to claim 4, wherein a side surface of the pad connecting the third surface and a fourth surface on the opposite side of the third surface is in contact with the insulating portion and the wiring structure.

7. The device according to claim 4, wherein in the orthogonal projection with respect to the first surface, the outer edge of the insulating portion is arranged so as to surround the wall surface.

8. The device according to claim 1, wherein in the orthogonal projection with respect to the first surface, the wall surface is arranged so as to surround the outer edge of the pad.

9. The device according to claim 8, wherein a part of a side surface of the pad connecting the third surface and a fourth surface on the opposite side of the third surface is exposed to the opening portion, and a remaining part of the side surface is in contact with the wiring structure.

10. The device according to claim 8, wherein the opening portion includes a first portion, and a second portion arranged between the first portion and the pad, and in the orthogonal projection with respect to the first surface, a wall surface of the first portion of the wall surface is arranged so as to surround the outer edge of the insulating portion, and a wall surface of the second portion of the wall surface is arranged between the outer edge of the insulating portion and the outer edge of the pad.

11. The device according to claim 10, wherein a part of a side surface of the pad connecting the third surface and a fourth surface on the opposite side of the third surface is exposed to the opening portion, and a remaining part of the side surface is in contact with the insulating portion and the wiring structure.

12. The device according to claim 1, wherein the pad is in contact with a wiring pattern arranged in a wiring layer closest to the second surface among the wiring layers arranged in the wiring structure.

13. The device according to claim 1, wherein the pad is connected, via a conductive member, to a wiring pattern arranged in a wiring layer closest to the second surface among the wiring layers arranged in the wiring structure.

14. The device according to claim 1, wherein the insulating portion comprises an STI structure.

15. The device according to claim 1, wherein the wiring structure includes a semiconductor layer different from the semiconductor layer.

16. The device according to claim 15, wherein an element configured to operate the semiconductor element is arranged in the different semiconductor layer.

17. The device according to claim 1, further including a semiconductor layer different from the semiconductor layer so as to cover the first surface.

18. The device according to claim 17, wherein the different semiconductor layer comprises a pixel region in which a pixel operated by the semiconductor element is arranged.

19. The device according to claim 1, wherein the semiconductor layer comprises a pixel region in which a pixel including the semiconductor element is arranged.

20. The device according to claim 1, wherein the wiring structure further includes a conductive member configured to electrically connect the semiconductor layer and a wiring pattern arranged in a wiring layer closest to the second surface among the wiring layers arranged in the wiring structure.

21. The device according to claim 1, further including a substrate stacked on the semiconductor layer via the wiring structure.

22. The device according to claim 21, wherein an element configured to operate the semiconductor element is arranged in the substrate.

23. An apparatus comprising:

the semiconductor device according to claim 1; and a processing device configured to process a signal output from the semiconductor device.

24. The device according to claim 1, wherein the humidity-resistance structure is arranged along the outer edge of the semiconductor device.

25. The device according to claim 1, wherein the semiconductor device comprises a plurality of pads including the pad, and the humidity-resistance structure is arranged so as to surround the plurality of pads.

26. The device according to claim 1, wherein the humidity-resistance structure includes at least one of one or more wiring patterns arranged in at least one of the wiring layers and a conductive pattern connecting wiring patterns arranged in different wiring layers of the wiring layers.

* * * * *